United States Patent
Lin

(10) Patent No.: US 10,530,617 B2
(45) Date of Patent: Jan. 7, 2020

(54) PROGRAMMABLE CHANNEL EQUALIZATION FOR MULTI-LEVEL SIGNALING

(71) Applicant: Micron Technology, Inc., Boise, ID (US)

(72) Inventor: Feng Lin, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/885,532

(22) Filed: Jan. 31, 2018

(65) Prior Publication Data

US 2019/0044762 A1 Feb. 7, 2019

Related U.S. Application Data

(60) Provisional application No. 62/542,263, filed on Aug. 7, 2017.

(51) Int. Cl.
| | | |
|---|---|---|
| *H03H 7/30* | (2006.01) | |
| *H03H 7/40* | (2006.01) | |
| *H03K 5/159* | (2006.01) | |
| *H04L 25/03* | (2006.01) | |

(52) U.S. Cl.
CPC ........... *H04L 25/03885* (2013.01); *H04L 2025/03363* (2013.01); *H04L 2025/03433* (2013.01); *H04L 2025/03777* (2013.01)

(58) Field of Classification Search
CPC ......... H04L 25/03885; H04L 25/03057; H04L 25/03159; H04L 25/03343
See application file for complete search history.

(56) References Cited

U.S. PATENT DOCUMENTS

| | | |
|---|---|---|
| 6,294,937 B1 | 9/2001 | Crafts et al. |
| 6,574,758 B1 | 6/2003 | Eccles |
| 7,126,378 B2 | 10/2006 | Stojanovic et al. |
| 7,269,212 B1 * | 9/2007 | Chau ............... H04L 25/03878 326/80 |
| 7,308,044 B2 | 12/2007 | Zerbeet et al. |
| 7,308,058 B2 | 12/2007 | Zerbe et al. |
| 7,509,368 B2 | 3/2009 | Anders et al. |
| 7,598,762 B2 | 10/2009 | Byun et al. |

(Continued)

OTHER PUBLICATIONS

International Search Report and Written Opinion of the International Searching Authority, for PCT/US2018/044381, dated Nov. 8, 2018, 15 pgs.

(Continued)

*Primary Examiner* — Shuwang Liu
*Assistant Examiner* — Gina M McKie
(74) *Attorney, Agent, or Firm* — Holland & Hart LLP

(57) ABSTRACT

A memory interface may include a transmitter that generates multi-level signals. The transmitter may employ channel equalization to improve the quality and robustness of the multi-level signals. The channel equalization may be controlled independently from the drive strength of the multi-level signals. For example, a first control signal may control the de-emphasis or pre-emphasis applied to a multi-level signal and a second control signal may control the drive strength of the multi-level signal. The first control signal may control a channel equalization driver circuit and the second control signal may control a driver circuit.

19 Claims, 7 Drawing Sheets

(56) References Cited

U.S. PATENT DOCUMENTS

| | | |
|---|---|---|
| 7,650,526 B2 | 1/2010 | Alon et al. |
| 7,692,447 B2 | 4/2010 | Cranford et al. |
| 7,714,615 B2 | 5/2010 | Liang et al. |
| 7,755,366 B2 | 7/2010 | Hosoe et al. |
| 7,853,846 B2 | 12/2010 | Cannon et al. |
| 7,961,008 B2 | 6/2011 | Kim et al. |
| 8,026,740 B2 | 9/2011 | Hollis |
| 8,049,530 B2 | 11/2011 | Batt |
| 8,072,253 B2 | 12/2011 | Kaeriyama et al. |
| 8,436,653 B2 | 5/2013 | Hollis |
| 8,570,789 B2 | 10/2013 | Chang |
| 8,604,828 B1 | 12/2013 | Bickford et al. |
| 8,669,792 B2 | 3/2014 | Rao |
| 8,781,022 B1 | 7/2014 | Chang et al. |
| 8,816,738 B2 | 8/2014 | Tatapudi et al. |
| 8,854,236 B2 | 10/2014 | Hollis |
| 9,148,170 B2 | 9/2015 | Hollis |
| 9,203,662 B2 | 12/2015 | Hollis |
| 9,286,697 B2 | 3/2016 | Igarashi |
| 9,324,454 B2 | 4/2016 | Hollis |
| 9,444,455 B2 | 9/2016 | Bhuiyan et al. |
| 9,509,535 B2 | 11/2016 | Hollis |
| 9,525,573 B2 | 12/2016 | Fiedler |
| 9,577,854 B1 | 2/2017 | Hollis |
| 9,621,160 B2 | 4/2017 | Tang |
| 9,712,257 B1* | 7/2017 | Tan ................. H04B 14/04 |
| 9,831,874 B1 | 11/2017 | Fortin |
| 9,917,711 B2 | 3/2018 | Ulrich |
| 9,972,363 B2 | 5/2018 | Tang |
| 10,015,027 B2 | 7/2018 | Schober |
| 10,043,557 B1 | 8/2018 | Hollis |
| 2002/0136343 A1* | 9/2002 | Cranford, Jr. ......... H03L 7/0995 375/376 |
| 2002/0149402 A1 | 10/2002 | Martin et al. |
| 2004/0085841 A1 | 5/2004 | Lim et al. |
| 2005/0258870 A1 | 11/2005 | Mitby et al. |
| 2006/0091901 A1 | 5/2006 | Kim |
| 2006/0091911 A1 | 5/2006 | Rho |
| 2006/0290439 A1* | 12/2006 | Martin ................ H04L 25/0276 333/24.1 |
| 2007/0136621 A1 | 6/2007 | Alon et al. |
| 2008/0129348 A1 | 6/2008 | Shau |
| 2008/0144411 A1 | 6/2008 | Tsern |
| 2009/0072860 A1 | 3/2009 | Lee |
| 2012/0092057 A1 | 4/2012 | Yu |
| 2013/0100737 A1 | 4/2013 | Kwak |
| 2013/0113521 A1 | 5/2013 | Song |
| 2013/0248801 A1 | 9/2013 | Yamamoto |
| 2014/0003549 A1 | 1/2014 | Won et al. |
| 2014/0159769 A1* | 6/2014 | Hong ................. H03K 19/0005 326/30 |
| 2014/0176196 A1 | 6/2014 | Li et al. |
| 2014/0226734 A1 | 8/2014 | Fox et al. |
| 2015/0071651 A1 | 3/2015 | Asmanis et al. |
| 2015/0104196 A1 | 4/2015 | Bae et al. |
| 2015/0171829 A1 | 6/2015 | Song et al. |
| 2015/0187441 A1 | 7/2015 | Hollis |
| 2016/0087819 A1 | 3/2016 | Poulton |
| 2016/0094202 A1* | 3/2016 | Hollis .................... H03K 3/011 327/109 |
| 2016/0119169 A1 | 4/2016 | Schober |
| 2016/0180897 A1 | 6/2016 | Shen et al. |
| 2016/0181950 A1 | 6/2016 | Yoscovich et al. |
| 2016/0189775 A1 | 6/2016 | Buchanan |
| 2016/0224243 A1 | 8/2016 | Son et al. |
| 2016/0301393 A1 | 10/2016 | Jung |
| 2016/0374091 A1 | 12/2016 | Saeki |
| 2016/0378597 A1 | 12/2016 | Chung et al. |
| 2017/0054656 A1 | 2/2017 | Luo et al. |
| 2017/0060803 A1 | 3/2017 | Shim |
| 2017/0075757 A1 | 3/2017 | Im et al. |
| 2017/0118048 A1 | 4/2017 | Ulrich |
| 2017/0141025 A1 | 5/2017 | Lee |
| 2017/0212695 A1 | 7/2017 | Hollis et al. |
| 2017/0222845 A1 | 8/2017 | Zerbe et al. |
| 2017/0337979 A1 | 11/2017 | Lee et al. |
| 2018/0123593 A1 | 5/2018 | Choi |
| 2018/0278440 A1 | 9/2018 | Dong |
| 2019/0043543 A1 | 2/2019 | Butterfield |
| 2019/0044766 A1 | 2/2019 | Lin |
| 2019/0044769 A1 | 2/2019 | Hollis et al. |

OTHER PUBLICATIONS

ISA/KR, International Search Report and Written Opinion of the International Searching Authority, Int'l. Appl. No. PCT/US2018/043311, dated Oct. 31, 2018, Korean Intellectual Property Office, Seo-gu, Daejeon, Republic of Korea, 12 pgs.

ISA/KR, International Search Report and Written Opinion of the International Searching Authority, Int'l. Appl. No. PCT/US2018/043648, dated Nov. 7, 2018, Korean Intellectual Property Office, Seo-gu, Daejeon, Republic of Korea, 14 pgs.

ISA/KR, International Search Report and Written Opinion of the International Searching Authority, Int'l Appl. No. PCT/US2018/044377, dated Nov. 8, 2018, Korean Intellectual Property Office, Seo-gu, Daejeon, Republic of Korea, 15 pgs.

ISA/KR, International Search Report and Written Opinion of the International Searching Authority, Int'l. Appl. No. PCT/US2018/044411, dated Nov. 14, 2018, Korean Intellectual Property Office, Seo-gu, Daejeon, Republic of Korea, 15 pgs.

Nadeesha Amarasinghe "A Single-ended Simultaneously Bidirectional Transceiver for Ultra-short Reach Die to Die Links" Master of Applied Science Graduate Department of Electrical and Computer Engineering, University of Toronto, 2016, 79pgs.

Office Action dated Apr. 23, 2019, issued in Taiwan Patent Application No. 107127205.

* cited by examiner

PROGRAMMABLE CHANNEL EQUALIZATION FOR MULTI-LEVEL SIGNALING

CROSS REFERENCES

The present Application for Patent claims priority to U.S. Provisional Patent Application No. 62/542,263 by Lin, et al., entitled "Programmable Channel Equalization For Multi-Level Signaling," filed Aug. 7, 2017, assigned to the assignee hereof, and expressly incorporated by reference herein.

RELATED REFERENCES

The present Application for claims is related to U.S. patent application Ser. No. 15/888,536 by Lin, et al., entitled "Channel Equalization For Multi-Level Signaling," filed concurrently with the present application, assigned to the assignee hereof, and U.S. Provisional Patent Application No. 62/542,166 by Lin, et al., entitled "Channel Equalization For Multi-Level Signaling," filed Aug. 7, 2017, assigned to the assignee here of, each of which is expressly incorporate by reference herein.

BACKGROUND

The following relates generally to channel equalization and more specifically to programmable channel equalization for multi-level signaling.

Memory devices are widely used to store information in various electronic devices such as computers, wireless communication devices, cameras, digital displays, and the like. Information is stored by programing different states into memory cells of a memory device.

For example, binary devices have two states, often denoted by a logic "1" or a logic "0." In other systems, more than two states may be stored. To access the stored information, a component of the memory device may read, or sense, the stored state in the memory cell. To store information, a component of the electronic device may write, or program, the state in the memory cell.

Multiple types of memory devices exist, including magnetic hard disks, random access memory (RAM), dynamic RAM (DRAM), synchronous dynamic RAM (SDRAM), ferroelectric RAM (FeRAM), magnetic RAM (MRAM), resistive RAM (RRAM), read only memory (ROM), flash memory, phase change memory (PCM), self-selecting memory, and others. Memory devices may be volatile or non-volatile. Non-volatile memory, e.g., flash memories, may maintain their stored logic state for extended periods of time even in the absence of an external power source. Volatile memory devices, e.g., DRAM, may lose their stored state over time unless they are periodically refreshed by an external power source. Improving memory devices may include increasing memory cell density, increasing read/write speeds, increasing reliability, increasing data retention, reducing power consumption, or reducing manufacturing costs, among other metrics.

DETAILED DESCRIPTION

A memory interface may enable communication of the information stored by a memory device (e.g., for use in graphics). But in some cases, the signals transferred by a memory interface may lose integrity due to distortions caused by the communication channel. For example, the signals may experience loss, delay, and reflections in the communication channel that alter the signals. If the signals experience too much alteration, the receiver may not be able to decode the signals and the information conveyed by the signals may be lost. When the signals are multi-level signals (e.g., multi-symbol signals) that convey multiple bits of information per unit interval, even more information may be lost compared to signals with fewer signals. Lost information may decrease system performance and overall user experience.

In some cases, de-emphasis or pre-emphasis may be applied to multi-level signals to compensate for channel distortions. For example, a multi-level signal may be applied with a de-emphasis or pre-emphasis adjustment that is proportional to the drive strength used for the multi-level signal. Such de-emphasis (or pre-emphasis) may be accomplished by using a single signal to control both the de-emphasis (or pre-emphasis) adjustment and the drive strength. But using a single signal to control de-emphasis (or pre-emphasis) and drive strength may result in a less than optimal ratio of de-emphasis (or pre-emphasis) to drive strength, which may decrease the linearity of the multi-level signal. According to the techniques described herein, de-emphasis (or pre-emphasis) and drive strength may be controlled independently so that an optimal de-emphasis (or pre-emphasis) to drive strength ratio can be achieved, which in turn improves the linearity of the multi-level signal. Improving the linearity of a multi-level signal may increase the ability of a receiver to successfully obtain the information conveyed by the multi-level signal.

Features of the disclosure introduced above are further described below in the context of a memory device. Specific examples are then described for a memory device that supports multi-level signaling with programmable de-emphasis or pre-emphasis. These and other features of the disclosure are further illustrated by and described with reference to apparatus diagrams, system diagrams, and flowcharts that relate to multi-level signaling (e.g., multi-symbol signaling). Multi-level signaling may refer to one or more signals modulated using a first modulation scheme having at least three levels.

Figure 1:
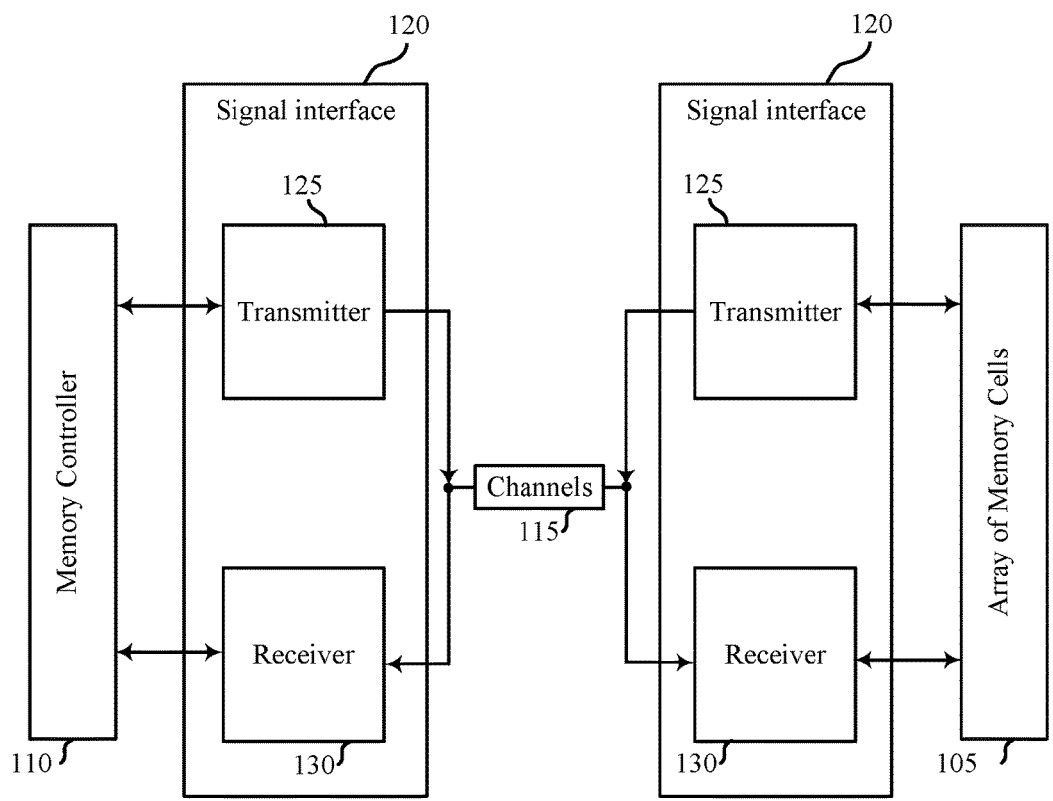
FIG. 1 illustrates an example of a memory device that supports programmable channel equalization for multi-level signals in accordance with various aspect of the present disclosure.

FIG. 1 illustrates an example memory device 100 in accordance with various examples of the present disclosure. The memory device 100 may also be referred to as an electronic memory apparatus. The memory device 100 may be configured to use multi-level signaling to communicate data between various components of the memory device 100. Multi-level signaling may also be referred to herein as multi-symbol signaling and may be implemented via multi-level modulations schemes such as PAM2, PAM4, PAM8, etc. So some examples of the multi-level signaling may include PAM signaling such as PAM4 signaling, PAM8 signaling, etc. The memory device 100 may include an array of memory cells 105, a controller 110, a plurality of channels 115, signaling interfaces 120, other components, or a combination thereof. A signaling interface 120 may also be referred to as a memory interface 120.

A memory device 100 may use multi-level signaling to increase the amount of information transmitted using a given bandwidth of frequency resources. In binary-level signaling, two symbols of a signal (e.g., two voltages levels) are used to represent up to two logic states (e.g., logic state '0' or logic state '1'). In multi-level signaling, a larger library of symbols may be used to represent data. Each symbol may represent more than two logic states (e.g., logic states with multiple bits). For example, if the signal is capable of four unique symbols, the signal may be used to represent up to four logic states (e.g., '00', '01', '10', and '11'). As a result, multiple bits of data may be compressed into a single symbol, thereby increasing the amount of data communicated using a given bandwidth.

In some cases of multi-level signaling, the amplitude of the signal may be used to generate the different symbols. For example, a first amplitude level may represent '00', a second amplitude level may represent '01', a third amplitude level may represent '10', and a fourth amplitude level may represent '11'. One drawback of some multi-level signaling schemes is that the symbols may be separated by a smaller voltage difference than symbols in other signaling schemes (e.g., binary-level signaling schemes). The smaller voltage separation may make the multi-level signaling scheme more susceptible to errors caused by noise or other aspects. The voltage separation of symbols in the multi-level signaling scheme, however, may be expanded by increasing a peak-to-peak transmitted power of a transmitted signal. In some situations, however, such an increase to peak-to-peak transmitted power may not be possible or may be difficult to achieve due to fixed power supply voltages, fixed signal power requirements, or other factors. Consequently, to implement multi-level signaling a transmitter may use more power and/or a receiver may be susceptible to an increased error rate, when compared to a binary-level signaling scheme.

A multi-level signal (sometimes referred to as a multi-symbol signal) may be a signal that is modulated using a modulation scheme that includes three or more unique symbols to represent data (e.g., two or more bits of data). The multi-level signal may be an example of an M-ary signal that is modulated using a modulation scheme where M is greater than or equal to three, where M represents the number of unique symbols, levels, or conditions possible in the modulation scheme. A multi-level signal or a multi-level modulation scheme may be referred to as a non-binary signal or non-binary modulation scheme in some instances. Examples of multi-level (or M-ary) modulation schemes related to a multi-level signal may include, but are not limited to, pulse amplitude modulation (e.g., PAM4, PAM8), quadrature amplitude modulation (QAM), quadrature phase shift keying (QPSK), and/or others.

A binary-level signal (sometimes referred to as a binary-symbol signal) may be a signal that is modulated using a modulation scheme that includes two unique symbols to represent one bit of data. The binary-level signal may be an example of an M-ary modulation scheme where M is less than or equal to 2. Examples of binary-level modulation schemes related to a binary-level signal include, but are not limited to, non-return-to-zero (NRZ), unipolar encoding, bipolar encoding, Manchester encoding, PAM2, and/or others.

In some cases, the conditions of channels 115 may further reduce the voltage separation between multi-level signals and create inter-symbol interference (ISI), which may degrade the integrity of the multi-level signals and make them hard to detect. The channels may affect the multi-level signals to the extent that a receiver 130 cannot successfully obtain the information conveyed by the multi-level signals, which may negatively impact the performance of the memory device 100. In some examples, a transmitter 125 may perform channel equalization prior to transmitting a multi-level signal over channels 115. For example, a transmitter 125 may de-emphasize (or pre-emphasize) a multi-level signal prior to transmitting the signal over channels 115. De-emphasizing or pre-emphasizing the multi-level signals may improve the separation between the signal levels and increase detectability at the receiver 130. De-emphasizing or pre-emphasizing a signal may also be referred to herein as channel equalization. In some cases, the transmitter 125 may perform other types of channel equalization such as feed-forward equalization (FFE). Although described with reference to de-emphasis and pre-emphasis, the channel equalization techniques disclosed herein are not limited to only that aspect and are related to broader aspects associated with equalization.

In some cases, the de-emphasis or pre-emphasis adjustment may be controlled by the same signal that controls the drive strength of the multi-level signal. But using a single signal to control de-emphasis (or pre-emphasis) and drive strength limits the ratios of de-emphasis (or pre-emphasis) to drive strength that can be applied to a multi-level signal, which may lead to sub-optimal characteristics in the signal (e.g., reduced linearity). According to the techniques described herein, the de-emphasis (or pre-emphasis) adjustment applied to a multi-level signal may be controlled independent from the drive-strength of the multi-level signal. For example, two separate signals may be used to control the de-emphasis (or pre-emphasis) and the drive strength. Use of two separate signals may allow for flexible de-emphasis (or pre-emphasis) to drive strength ratios, which may improve the linearity and output swing of the associated multi-level signals.

Each memory cell of the array of memory cells 105 may be programmable to store different states. For example, each memory cell may be programmed to store two or more logic states (e.g., a logic '0', a logic '1', a logic '00', a logic '01', a logic '10', a logic '11', etc.). A memory cell may store a charge representative of the programmable states in a capacitor; for example, a charged and uncharged capacitor may represent two logic states, respectively. The memory cells of the array of memory cells 105 may use any number of storage mediums including DRAM, FeRAM, PCM, or other types of memory cells. A DRAM memory cell may include a capacitor with a dielectric material as the insulating material. For example, the dielectric material may have linear or para-electric electric polarization properties and a ferroelectric memory cell may include a capacitor with a ferroelectric material as the insulating material. In instances where the storage medium includes FeRAM, different levels of charge of a ferroelectric capacitor may represent different logic states.

The array of memory cells 105 may be or include a three-dimensional (3D) array, where multiple two-dimensional (2D) arrays or multiple memory cells are formed on top of one another. Such a configuration may increase the number of memory cells that may be formed on a single die or substrate as compared with 2D arrays. In turn, this may reduce production costs or increase the performance of the memory array, or both. Each level of the array may be aligned or positioned so that memory cells may be approximately aligned with one another across each level, forming a memory cell stack.

In some examples, the array of memory cells 105 may include a memory cell, a word line, a digit line, and a sense component. In some examples, the array of memory cells 105 may include a plate line (e.g., in the case of FeRAM). A memory cell of the array of memory cells 105 may include a selection component and a logic storage component, such as capacitor that includes a first plate, a cell plate, a second plate, and a cell bottom. The cell plate and cell bottom may be capacitively coupled through an insulating material (e.g., dielectric, ferroelectric, or PCM material) positioned between them.

The memory cell of the array of memory cells 105 may be accessed (e.g., during a read operation, write operation, or other operation) using various combinations of word lines, digit lines, and/or plate lines. In some cases, some memory cells may share access lines (e.g., digit lines, word lines, plate lines) with other memory cells. For example, a digit line may be shared with memory cells in a same column, a word line may be shared with memory cells in a same row, and a plate line may be shared with memory cells in a same section, tile, deck, or multiple decks. As described above, various states may be stored by charging or discharging the capacitor of the memory cell.

The stored state of the capacitor of the memory cell may be read or sensed by operating various elements. The capacitor may be in electronic communication with a digit line. The capacitor may be isolated from digit line when selection component is deactivated, and capacitor can be connected to digit line when selection component is activated (e.g., by the word line). Activating selection component may be referred to as selecting a memory cell. In some cases, the selection component may be a transistor and its operation may be controlled by applying a voltage to the transistor gate, where the voltage magnitude is greater than the threshold magnitude of the transistor. The word line may activate the selection component; for example, a voltage applied to a transistor gate of a word line may connect a capacitor of a memory cell with a digit line.

The change in voltage of a digit line may, in some examples, depend on its intrinsic capacitance. That is, as charge flows through the digit line, some finite charge may be stored in the digit line and the resulting voltage depends on the intrinsic capacitance. The intrinsic capacitance may depend on physical characteristics, including the dimensions, of the digit line. The digit line may connect many memory cells of the array of memory cells 105 so digit line may have a length that results in a non-negligible capacitance (e.g., on the order of picofarads (pF)). The resulting voltage of the digit line may then be compared to a reference voltage (e.g., a voltage of a reference line) by a sense component in order to determine the stored logic state in the memory cell. Other sensing processes may be used.

The sense component may include various transistors or amplifiers to detect and amplify a difference in signals, which may be referred to as latching. The sense component may include a sense amplifier that receives and compares the voltage of the digit line and a reference line, which may be a reference voltage. The sense amplifier output may be driven to the higher (e.g., a positive) or lower (e.g., negative or ground) supply voltage based on the comparison. For instance, if the digit line has a higher voltage than reference line, then the sense amplifier output may be driven to a positive supply voltage.

In some cases, the sense amplifier may drive the digit line to the supply voltage. The sense component may then latch the output of the sense amplifier and/or the voltage of the digit line, which may be used to determine the stored state in the memory cell (e.g., logic '1'). Alternatively, for example, if the digit line has a lower voltage than reference line, the sense amplifier output may be driven to a negative or ground voltage. The sense component may similarly latch the sense amplifier output to determine the stored state in the memory cell (e.g., logic '0'). The latched logic state of the memory cell may then be output, for example, through a column decoder.

To write a memory cell, a voltage may be applied across the capacitor of the memory cell. Various methods may be used to write a memory cell. In one example, the selection component may be activated through a word line in order to electrically connect the capacitor to the digit line. A voltage may be applied across the capacitor by controlling the voltage of the cell plate (e.g., through a plate line) and the cell bottom (e.g., through a digit line). To write a logic '0', the cell plate may be taken high (e.g., a voltage level may be increased above a predetermined voltage that is a "high" voltage). That is, a positive voltage may be applied to plate line, and the cell bottom may be taken low (e.g., virtually grounding or applying a negative voltage to the digit line). The opposite process may be performed to write a logic '1', where the cell plate is taken low and the cell bottom is taken high.

The controller 110 may control the operation (e.g., read, write, re-write, refresh, precharge, etc.) of memory cells in the array of memory cells 105 through the various components (e.g., row decoders, column decoders, and sense components). In some cases, one or more of the row decoder, column decoder, and sense component may be co-located with the controller 110. Controller 110 may generate row and column address signals in order to activate the desired word line and digit line. In other examples, controller 110 may generate and control various voltages or currents used during the operation of memory device 100. For example, controller 110 may apply discharge voltages to a word line or digit line after accessing one or more memory cells. In general, the amplitude, shape, or duration of an applied voltage or current discussed herein may be adjusted or varied and may be different for the various operations discussed in operating the memory device 100. Furthermore, one, multiple, or all memory cells within the array of memory cells 105 may be accessed simultaneously. For example, multiple memory cells or all memory cells of the array of memory cells 105 may be accessed simultaneously during a reset operation in which multiple memory cells or all memory cells may be set to a single logic state (e.g., logic '0').

In some examples, at least some (and in some cases, each) of the signaling interfaces 120 may generate and/or decode signals communicated using the plurality of channels 115. A signaling interface 120 may be associated with each component that is coupled with the plurality of channels 115. The signaling interface 120 may be configured to generate and/or decode multi-level signals, binary-level signals, or both (e.g., simultaneously). Each signaling interface 120 may include a transmitter 125 and a receiver 130. In some examples, each transmitter 125 may be referred to as a multi-leg driver.

Each transmitter 125 may be configured to generate a multi-level signal based on a logic state that includes multiple bits. For example, transmitter 125 may use PAM4 signaling techniques (or other type of multi-level signaling techniques) to generate a signal having an amplitude that corresponds to the logic state. The transmitter 125 may be configured to receive data using a single input line. In some cases, the transmitter 125 may include a first input line for a first bit of data (e.g., most-significant bit), a second input line for a second bit of data (e.g., least-significant bit). In some circumstances, the transmitter 125 may be configured to generate a binary-level signal (e.g., a NRZ signal). In some cases, the transmitter 125 may use single-ended signaling to generate the multi-level signal. In such cases, the multi-level signal may be transmitted without a differential.

Each receiver 130 may be configured to determine a logic state represented by a symbol of the multi-level signal received using the plurality of channels 115. In some cases, the receiver 130 may determine an amplitude of the received multi-level signal. Based on the determined amplitude, the receiver 130 may determine the logic state represented by a symbol of the multi-level signal. The receiver 130 may be configured to output data using a single output line. In some cases, the receiver 130 may include a first output line for a first bit of data (e.g., most-significant bit), a second output line for a second bit of data (e.g., least-significant bit). In some circumstances, the receiver 130 may be configured to decode a binary-level signal (e.g., a NRZ signal). For example, each of receivers 130 may be coupled with a transmitter (not illustrated) via a plurality of channels 115. Each of the channels 115 may be configured to output data that includes multiple bits, and the controller 110 may be configured to determine an output impedance offset between the data output. One or more transistors (not separately illustrated) may be configured to adjust a resistance level one or more of the pluralities of channels 115. This adjustment may be based at least in part on the determined output impedance offset.

In some cases, each of the signaling interfaces 120 may be configured to selectively generate and/or decode different types of signals (e.g., NRZ signals, PAM4 signals, PAM8 signals, etc.). Different types of signals may be used based on the operational circumstances of the memory device 100. For example, binary-level signaling may use less power than multi-level signaling and may be used when power consumption is driving consideration for performance. Other performance factors that may be used to determine which type of signaling should be used may include clock considerations, data strobe (DQS) considerations, circuit capabilities, bandwidth considerations, jitter considerations, or combinations thereof. In some cases, the controller 110 may be configured to select the type of signal, and the signaling interfaces 120 may be configured to implement the selection based on instructions received from the controller 110. In some cases, each of the signaling interfaces 120 may be configured to implement coding functions such as error detection procedures, error correction procedures, data bus inversion procedures, or combinations thereof.

In some cases, the signaling interfaces 120 may be configured to communicate multi-level signals and binary-level signals simultaneously. In such cases, a signaling interface 120 may include more than one set of transmitters 125 and receivers 130. For example, a signaling interface 120 may be configured to communicate a first set of data (e.g., a control signal) using a binary-level signal using a first set of channels 115 at the same time that a second set of data (e.g., user information) is being communicated using a multi-level signal using a second set of channels 115.

Figure 2:
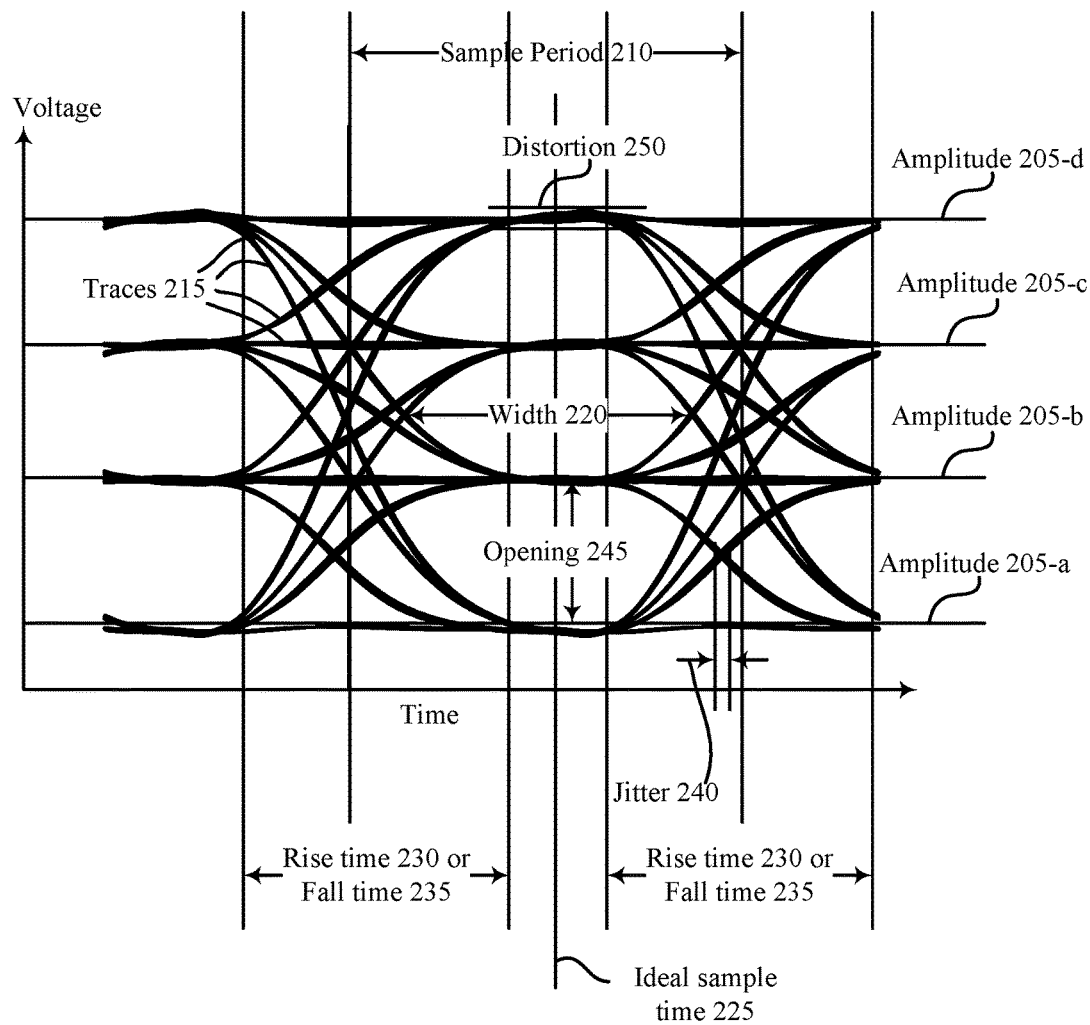
FIG. 2 illustrates an example of an eye diagram that supports programmable channel equalization for multi-level signals in accordance with various aspect of the present disclosure.

FIG. 2 illustrates an example of an eye diagram 200 representing a multi-level signal in accordance with various embodiments of the present disclosure. The eye diagram 200 may be used to indicate the quality of signals in high-speed transmissions and may represent four symbols of a signal (e.g., '00', '01', '10', or '11'). In some examples, each of the four symbols may be represented by a different voltage amplitude (e.g., amplitudes 205-a, 205-b, 205-c, 205-d). In other examples, the eye diagram 200 may represent a PAM4 signal that may be used to communicate data in a memory device (e.g., memory device 100 as described with reference to FIG. 1). The eye diagram 200 may be used to provide a visual indication of the health of the signal integrity, and may indicate noise margins of the data signal. The noise margin may, for example, refer to an amount by which the signal exceeds the ideal boundaries of the amplitudes 205.

To generate the eye diagram 200, an oscilloscope or other computing device may sample a digital signal according to a sample period 210 (e.g., a unit interval or a bit period). The sample period 210 may be defined by a clock associated with the transmission of the measured signal. In some examples, the oscilloscope or other computing device may measure the voltage level of the signal during the sample period 210 to form a trace 215. Noise and other factors can result in the traces 215 measured from the signal deviating from a set of ideal step functions. By overlaying a plurality of traces 215, various characteristics about the measured signal may be determined. For example, the eye diagram 200 may be used to identify a number of characteristics of a communication signals such as jitter, cross talk, electromagnetic interference (EMI), signal loss, signal-to-noise ratio (SNR), other characteristics, or combinations thereof. A closed eye may indicate a noisy and/or unpredictable signal or other problems.

In some examples, the eye diagram 200 may indicate a width 220. The width 220 of an eye in the eye diagram 200 may be used to indicate a timing synchronization of the measured signal or jitter effects of the measured signal. In some examples, comparing the width 220 to the sample period 210 may provide a measurement of SNR of the measured signal. Each eye in an eye diagram may have a unique width based on the characteristics of the measured signal. Various encoding and decoding techniques may be used to modify the width 220 of the measured signal.

In other examples, the eye diagram 200 may indicate a sampling time 225 (e.g., an ideal sampling time) for determining the value of a logic state represented by a symbol of the measured signal. For example, determining a correct time for sampling data (e.g., timing synchronization) of the measured signal may be important to minimize the error rate in detection of the signal. For example, if a computing device samples a signal during a transition time (e.g., a rise time 230 or a fall time 235), errors may be introduced by the decoder into the data represented by a symbol of the signal.

Various encoding and decoding techniques may be used to modify the ideal sampling time 225 of the measured signal.

The eye diagram 200 may be used to identify a rise time 230 and/or a fall time 235 for transitions from a first amplitude 205 to a second amplitude 205. The slope of the trace 215 during the rise time 230 or fall time 235 may indicate the signal's sensitivity to timing error, among other aspects. For example, the steeper the slope of the trace 215 (e.g., the smaller the rise time 230 and/or the fall times 235), the more ideal the transitions between amplitudes 205 are. Various encoding and decoding techniques may be used to modify the rise time 230 and/or fall time 235 of the measured signal.

In some examples, the eye diagram 200 may be used to identify an amount of jitter 240 in the measured signal. Jitter 240 may refer to a timing error that results from a misalignment of rise and fall times. Jitter 240 occurs when a rising edge or falling edge occurs at a time that is different from an ideal time defined by the data clock. Jitter 240 may be caused by signal reflections, intersymbol interference, crosstalk, process-voltage-temperature (PVT) variations, random jitter, additive noise, or combinations thereof. Various encoding and decoding techniques may be used to modify the jitter 240 of the measured signal. In some cases, the jitter 240 for each signal level or each eye may be different.

In other examples, the eye diagram 200 may indicate an eye opening 245, which may represent a peak-to-peak voltage difference between the various amplitudes 205. The eye opening 245 may be related to a voltage margin for discriminating between different amplitudes 205 of the measured signal. The smaller the margin, the more difficult it may be to discriminate between neighboring amplitudes, and the more errors that may be introduced due to noise. In some cases, a receiver (e.g., receiver 130 as described with reference to FIG. 1) of the signal may compare the signal to one or more threshold voltages positioned between the various amplitudes 205. In other cases, the larger the eye opening 245, the less likely it is that noise will cause the one or more voltage thresholds to be satisfied in error. The eye opening 245 may be used indicate an amount of additive noise in the measured signal, and may be used to determine a SNR of the measured signal. Various encoding and decoding techniques may be used to modify the eye opening 245 of the measured signal. In some cases, the eye opening 245 for each eye may be different. In such cases, the eyes of the multi-level signal may not be identical.

In other examples, the eye diagram 200 may indicate distortion 250. The distortion 250 may represent overshoot and/or undershoot of the measured signal due to noise or interruptions in the signal path. As a signal settles into a new amplitude (e.g., amplitude 205-b) from an old amplitude (e.g., an amplitude 205-c), the signal may overshoot and/or undershoot the new amplitude level. In some examples, distortion 250 may be caused by this overshooting and/or undershooting, and may be caused additive noise in the signal or interruptions in the signal path. Each eye in an eye diagram may have a unique opening based on the characteristics of the measured signal. Various encoding and decoding techniques may be used to modify the distortion 250 of the measured signal. In some cases, the distortion 250 for each signal level or each eye may be different.

The locations of the characteristics of the eye diagram 200 shown in FIG. 2 are for illustrative purposes only. Characteristics such as width 220, sampling time 225, rise time 230, fall time 235, jitter 240, eye opening 245, and/or distortion 250 may occur in other parts of the eye diagram 200 not specifically indicated in FIG. 2.

According to the techniques described herein, programmable channel equalization (e.g., de-emphasis, pre-emphasis, FFE, etc.) may be applied to multi-level signals to compensate for the above-described negative effects and increase output linearity.

Figure 3:
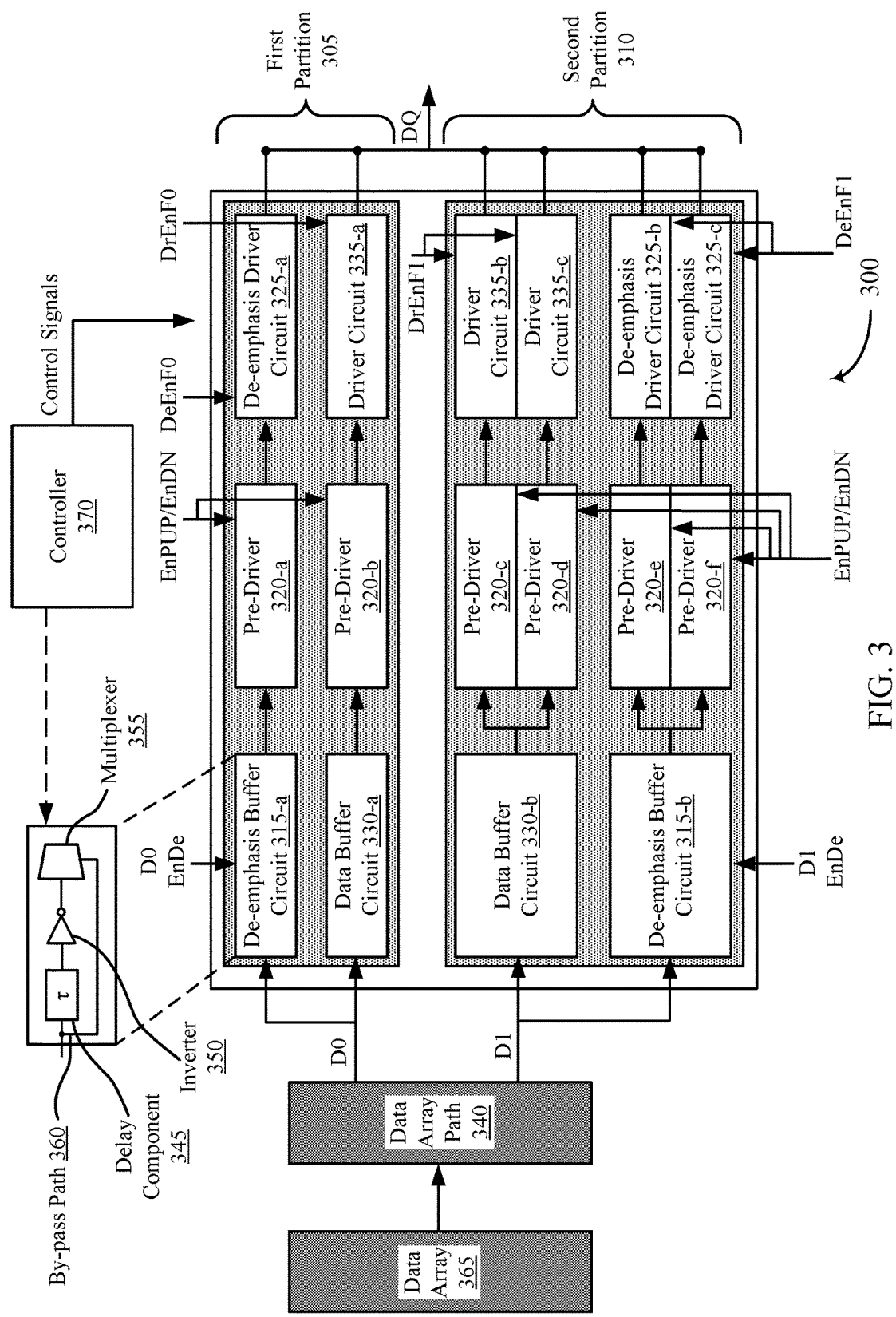
FIG. 3 illustrates an example of a multi-level signal transmitter that supports programmable channel equalization for multi-level signals in accordance with various aspect of the present disclosure.

FIG. 3 illustrates a multi-level signal transmitter 300 that supports programmable channel equalization for multi-level signaling in accordance with examples of the present disclosure. Transmitter 300 may be part of a signaling interface 120 as described with reference to FIG. 1 (e.g., transmitter 300 may be part of a transmitter 125). The transmitter 300 may also be referred to herein as an apparatus. Transmitter 300 may include two partitions: a first partition 305, which includes the components and data path for one bit (e.g., the least significant bit (LSB)) in a multi-level signal (e.g., a PAM4 symbol), and a second partition 310, which includes the components and data path for a second bit (e.g., the most significant bit (MSB)) in a multi-level signal (e.g., the PAM4 symbol). Each partition may be connected to a different data line (e.g., first partition 305 may be in electronic communication with data line D0 and second partition 310 may be in electronic communication with data line D1). A data line may be a conductive path capable of transferring charge from one component to another.

The first and second partitions may output signals that can be combined (e.g., summed or superimposed) to create a PAM4 symbol. The first partition 305 may correspond to the LSB in a PAM4 symbol and may be configured to drive the DQ level with one amplitude when the LSB is 1 and another amplitude when the LSB is 0. For example, when the LSB is 1, the first partition may be configured to provide or output a signal that ultimately boosts the resulting symbol by a predetermined amount (e.g., the amount necessary to distinguish amplitude 205-b from amplitude 205-a in FIG. 2). Similarly, the second partition 310 may correspond to the MSB in a PAM4 symbol and may be configured to drive the DQ level with one amplitude when the MSB is 1 and another amplitude when the MSB is 0. For example, when the MSB is 1, the second partition 310 may be configured to provide or output a signal that ultimately boosts the resulting symbol by a predetermined amount (e.g., the amount necessary to distinguish amplitude 205-d from amplitude 205-b in FIG. 2).

Thus, the DQ levels output by the partitions when the corresponding bits are '1' may vary. For example, the first partition 305 may drive the DQ level to an amplitude that corresponds to the LSB and the second partition may drive the DQ level to an amplitude that corresponds to the MSB. So a PAM4 symbol may be generated by adding the LSB to the MSB. In such a scenario, the second partition 310 may be configured to drive the DQ level to twice the amplitude output by the first partition 305, which may be achieved by using twice as many components (e.g., twice as many pre-drivers and driver circuits) in the second partition 310 compared to the first partition 305. Although such a configuration is shown in FIG. 3, the techniques described herein are compatible with alternative configurations.

The transmitter may also include, or be in electronic communication with, a data array path 340. Data from a data array (e.g., data array 365) may be passed to one or more components of transmitter 300 via the data array path 340, which may include one or more sense amplifiers, data lines, data latches, multiplexing circuits, or serialization circuits. So data (e.g., one or more data signals or bits) may be transferred from the data array 365 to the first partition 305 and the second partition 310 via data array path 340.

Each partition may include a main data path and channel equalization path (e.g., a de-emphasis path or pre-emphasis path). When de-emphasis is used, a channel equalization path may include at least one de-emphasis buffer circuit 315, pre-driver circuit 320, and de-emphasis driver circuit 325-a. When pre-emphasis is used, a channel equalization path may include at least one pre-emphasis buffer circuit, pre-driver circuit, and pre-emphasis driver circuit. A main data path may include at least one data buffer circuit 330, pre-driver circuit 320, and driver circuit 335. According to the techniques described herein, a first data signal (e.g., a first bit, or stream of bits) may be transferred from the data array 365 (e.g., via data array path 340) to de-emphasis buffer circuit 315-a and data buffer circuit 330-a. The first data signal may be transferred over the first data line D0. A second data signal (e.g., a second bit or stream of bits) may be transferred from the data array path 340 to de-emphasis buffer circuit 315-b (or, in pre-emphasis implementations, to pre-emphasis buffer circuit 315-b) and data buffer circuit 330-b. In some cases, data buffer circuit 330-b may be made up of a pair of data buffers.

The data buffer circuits 330 may temporarily store the received data signals before transferring them to the pre-driver circuits 320. Thus, the signal output by the data buffer circuits 330 may be a delayed version of the data signal received from the data array path 340. The duration of time by which the data signal is delayed may be referred to herein as the data buffer delay. The data buffer delay may be less than the delay introduced by the de-emphasis (or pre-emphasis) buffer circuits 315. The data buffer circuits 330 may include a number of transistors configured so that the voltage and current of the signal output by the data buffer circuits matches the voltage and current of the input signal. Here, data buffer circuit 330-a may transfer the first data signal to pre-driver circuit 320-b and data buffer circuit 330-b may transfer the second data signal to pre-driver circuit 320-c and pre-driver circuit 320-d. Although a single data buffer circuit 330-a and data buffer circuit 330-b are shown, transmitter 300 may include multiple data buffer circuits 330-a and multiple data buffer circuits 330-b.

The de-emphasis buffer circuits 315 may generate de-emphasis control signals based on the received data signals and transfer the control signals to the pre-drivers 320. Similarly, when a pre-emphasis implementation is used, pre-emphasis buffer circuits 315 may generate pre-emphasis control signals based on the received data signals and transfer the control signals to the pre-drivers 320. The de-emphasis (or pre-emphasis) control signals may then be propagated through the pre-drivers 320 (possibly after some modification) to the final drivers (e.g., de-emphasis or pre-emphasis driver circuits 325). Based on the control signals, the de-emphasis driver circuits 325 (or pre-emphasis driver circuits 325) may generate, drive, output, or modify a signal that de-emphasizes (or pre-emphasizes) the final output signal. So when a buffer circuit 315 generates a control signal, the buffer circuit 315 is modifying (e.g., delaying and inverting) a data signal to control the de-emphasis or pre-emphasis of signal output by transmitter 300. Thus, the buffer circuits 315 may generate proper control signals for de-emphasis or pre-emphasis based on the input data signal.

Generally, "de-emphasis" is associated with reducing a signal amplitude after a transition of the signal. De-emphasis in this context can be accomplished by reducing the low frequency components of the signal, which decreases the overall amplitude of the signal. For instance, the low frequency components of a signal can be reduced after transition of the signal by adding an inverted and delayed version of the signal to the original signal. As used herein, "de-emphasis" may also refer to manipulating a signal so that when it is added to the original signal, the resulting signal is de-emphasized in the first sense of the word.

According to the techniques described herein, de-emphasis buffer circuit 315-a may modify (e.g., delay and invert) the first data signal received from data array path 340 (e.g., over first data line D0) and de-emphasis buffer circuit 315-b may modify (e.g., delay and invert) the second data signal received from data array path 340 (e.g., over second data line D1). The modified data signals may serve as control signals as described above. For example, the first control signal may control aspects of the de-emphasis applied by de-emphasis driver circuit 325-a and the second control may control aspects of the de-emphasis applied by de-emphasis driver circuit 325-b. The delay $\tau$ can be used to determine how long the de-emphasis lasts (e.g., for a full UI, for a fraction of a UI) and the ratio between each de-emphasis driver circuit 325 and its corresponding driver circuit 335 may determine the amplitude of the equalization. So the de-emphasis applied by the de-emphasis driver circuits may be the same or different and may be scaled based on the control of the first and second data signals. The amount of delay and the scaling factor used in the de-emphasis may be referred to herein as the de-emphasis adjustment. A similar process may be used in the pre-emphasis implementation. For example, in some cases, the de-emphasis buffer circuits 315 are pre-emphasis buffer circuits that pre-emphasize received data signals or FFE components that shape received signals based on the channel response.

As noted, de-emphasizing a signal may include suppressing low-frequency components of the signal to compensate for degradation of the signal's high-frequency components due to channel loss. Pre-emphasizing a signal may include boosting the high-frequency components of the signal to compensate for attenuation incurred in the channel. The de-emphasis buffer circuits 315 may include a delay component 345, an inverter 350, and a multiplexer 355. The delay component 345 may receive the data signal from the data array path 340 and delay it for a delay of $\tau$. The delay $\tau$ may be selected so that the propagation delay through the de-emphasis buffer circuit 315-a represents how long the de-emphasis would last. The inverter 350 may receive the delayed data signal, invert it, and pass the inverted signal to the multiplexer 355.

The multiplexer 355 may activate and deactivate (e.g., turn on and off) the de-emphasis buffer circuit 315-a, as controlled by a select signal EnDe. There may be a select signal EnDe for each de-emphasis or pre-emphasis buffer circuit (e.g., a first select signal D0 EnDe for de-emphasis buffer circuit 315-a and a second select signal D1 EnDe for de-emphasis buffer circuit 315-b). The select signals D0 EnDe and D1 EnDe, also referred to as enable signals D0 EnDe and D1 EnDe, may convey different control information so that the de-emphasis buffer circuits 315 (or pre-emphasis buffer circuits 315) can be activated independently.

When a de-emphasis buffer circuit 315-a is enabled or activated, the data signal may pass through the delay component 345 and the inverter 350. When the de-emphasis buffer circuit 315-a is de-activated, the data signal may by-pass the delay component 345 and the inverter 350 (e.g., by taking by-pass path 360). As discussed above, the delayed and inverted data signal may control de-emphasis, which may increase the detectability of a multi-level signal at a receiver. De-emphasis buffer circuit 315-b may be implemented in a similar fashion as de-emphasis buffer circuit 315-*a*. Although a single de-emphasis buffer circuit 315-*a* and de-emphasis buffer circuit 315-*b* are shown, transmitter 300 may include multiple de-emphasis buffer circuits 315-*a* and multiple de-emphasis buffer circuits 315-*b*.

As described above, de-emphasis buffer circuit 315-*a* may transfer the first control signal to pre-driver 320-*a* and de-emphasis buffer circuit 315-*b* may transfer the second control signal to pre-driver 320-*c* and pre-driver 320-*d*. The pre-drivers 320 may condition or modify the received control signals before passing them to their respective driver circuits (e.g., the pre-driver circuits 320 may modify the signals output by the de-emphasis driver circuits 325 to improve the characteristics or quality of the communication signal). The pre-drivers 320 may additionally or alternatively act as selectors. For example, each pre-driver circuit 320 may select and control the corresponding driver circuit. The pre-driver circuits 320 in turn may be controlled by select signals such as EnPUP/EnDN, which may activate the pre-driver circuits 320 and control which driver circuits are selected.

Although a single pre-driver circuit 320 is shown for each data path, there may be multiple pre-driver circuits 320 per data path. For example, each data path may include two pre-driver circuits, one of which is a pull-up pre-driver circuit and one of which is a pull-down pre-driver circuit. Thus, the pre-driver circuits 320 may be pull-up or pull-down pre-driver circuits.

Each pre-driver 320 may transfer or output a modified version of its input signal to a driver circuit. For example, pre-driver 320-*a* may transfer a modified version of the delayed and inverted first data signal (e.g., a first de-emphasis control signal) to de-emphasis driver circuit 325-*a* and pre-driver 320-*b* may transfer a modified version of the first data signal (e.g., a first driver control signal) to driver circuit 335-*a*. Similarly, pre-driver 320-*e* may transfer a modified version of the delayed and inverted second signal (e.g., a second de-emphasis control signal) to de-emphasis driver circuit 325-*b* and pre-driver 320-*f* may transfer a modified version of the delayed and inverted second signal (e.g., a third de-emphasis control signal) to de-emphasis driver circuit 325-*c*. Pre-driver 320-*c* may transfer a modified version of the second data signal (e.g., a second driver control signal) to driver circuit 335-*b* and pre-driver 320-*d* may transfer a modified version of the second data signal (e.g., a third driver control signal) to driver circuit 335-*c*. A modified version of a signal sent though the paths corresponding to data buffer circuits 330 may not be inverted or delayed. Although described with reference to de-emphasis, the transfer of signals in transmitter 300 may be similar for pre-emphasis implementations.

De-emphasis driver circuits 325 and driver circuits 335 may increase or decrease the drive strength (e.g., the voltage or current) of the signals they receive from the pre-driver circuits 320. For example, de-emphasis driver circuit 325-*a* (or pre-emphasis driver circuit 325-*a*) may increase or decrease the drive strength of the modified version of the first data signal received from pre-driver circuit 320-*a*. When a de-emphasis driver circuit is used, the drive strength of the output signal may be reduced. When a pre-emphasis driver circuit is used, the drive strength of the output signal may be increased. The outputs of driver circuits 325 and driver circuits 335 may be combined (e.g., superimposed) to create a de-emphasized or pre-emphasized symbol, represented by DQ. As discussed above, the amount by which a driver circuit modifies or adjusts the strength of a signal may be controlled by or based on a control signal (e.g., a control signal from a controller 370 and/or a control signal from a pre-driver 320). According to the techniques described herein, different (e.g., separate or independent) control signals may be used to control de-emphasis driver circuits 325 and driver circuits 335.

In one example, de-emphasis (or pre-emphasis) driver circuit 325-*a* may be partially or exclusively controlled by a control signal (e.g., DeEnF0) received from controller 370 and driver circuit 335-*a* may be partially or exclusively controlled by a control signal (e.g., DrEnF0) received from controller 370. Similarly, de-emphasis (or pre-emphasis) driver circuits 325-*b* and 325-*c* may be partially or exclusively controlled by control signals (e.g., enable signal DeEnF1) received from controller 370 and driver circuits 335-*b* and 335-*c* may be partially or exclusively controlled by control signals (e.g., enable signal DrEnF1) received from controller 370. Use of separate controls signals for driver circuits 335 and de-emphasis (or pre-emphasis) driver circuits 325 may enable de-emphasis (or pre-emphasis) adjustments to be tuned to provide improved signal linearity and output swing. In some cases, the control signals generated by controller 370 may be enable signals that activate de-emphasis (or pre-emphasis) drivers 325 and driver circuits 335.

In another example, de-emphasis (or pre-emphasis) drivers 325 and driver circuits 335 may be partially or exclusively controlled by control signals from pre-drivers 320. For example, de-emphasis (or pre-emphasis) driver 325-*a* may be partially or exclusively controlled by a first control signal from pre-driver 320-*a* and driver circuit 335-*a* may be partially or exclusively controlled by a second control signal from pre-driver 320-*b*. In some cases, de-emphasis (or pre-emphasis) drivers 325 and driver circuits 335 may be controlled by control signals from controller 370 and control signals from pre-drivers 320. For example, control signals from controller 370 may control certain aspects of de-emphasis (or pre-emphasis) drivers 325 and driver circuits 335 and control signals from pre-drivers 320 may control different aspects of de-emphasis (pre-emphasis) drivers 325 and driver circuits 335.

In some cases, controller 370 may control aspects of de-emphasis (or pre-emphasis) buffer circuits 315. For example, controller 370 may enable or disable the de-emphasis (or pre-emphasis) buffer circuits 315 using enable signals D0EnDe and D1EnDe. Additionally or alternatively, controller 370 may control aspects of the de-emphasis (or pre-emphasis) buffers 315, such as the duration of delay $\tau$. So in some cases, controller 370 may use control signals to control the output of de-emphasis (or pre-emphasis) buffer circuits 315.

The outputs of de-emphasis (or pre-emphasis) driver circuits 325 and driver circuits 335 may be combined (e.g., superimposed) to create a de-emphasized (or pre-emphasized) symbol (e.g., a PAM4 symbol), represented by DQ. For instance, de-emphasis (or pre-emphasis) driver circuit 325-*a* may be configured to drive a signal that is delayed and inverted compared to the signal output by driver circuit 335-*a*. When the signal output by de-emphasis driver circuit 325-*a* is combined with the signal output by driver circuit 335-*a*, the resulting signal represents the LSB but includes low frequency components that have been decreased compared to the other frequency components (e.g., to compensate for the anticipated loss in high frequency components over the channel). Similarly, the de-emphasis driver circuits 325-*b* and 325-*c* may be configured to drive signals that are delayed and inverted compared to the signals output by the driver circuits 335-*b* and 335-*c*. When the signals output by de-emphasis driver circuits 325-*b* and 325-*c* are combined with the signals output by driver circuits 335-*b* and 335-*c*, the resulting signal represents the MSB but includes low frequency components that have been reduced compared to the other frequency components (e.g., to compensate for the anticipated loss in high frequency components over the channel).

When the signal output by pre-emphasis driver circuit 325-*a* is combined with the signal output by driver circuit 335-*a*, the resulting signal represents the LSB but includes high frequency components that have been magnified or increased compared to the other frequency components (e.g., to compensate for the anticipated loss in high frequency components over the channel). Similarly, the pre-emphasis driver circuits 325-*b* and 325-*c* may be configured to drive signals that are delayed and inverted compared to the signals output by the driver circuits 335-*b* and 335-*c*. When the signals output by pre-emphasis driver circuits 325-*b* and 325-*c* are combined with the signals output by driver circuits 335-*b* and 335-*c*, the resulting signal represents the MSB but includes high frequency components that have been magnified or increased compared to the other frequency components (e.g., to compensate for the anticipated loss in high frequency components over the channel).

The combination of all the signals output by the de-emphasis driver circuits 325 and driver circuits 335 may represent a deemphasized PAM4 symbol. Similarly, the combination of all the signals output by the pre-emphasis driver circuits 325 and driver circuits 335 may represent a pre-emphasized PAM4 symbol. The symbol may represent or convey the first data signal (e.g., the logic state associated with the first data signal, such as the LSB) and the second data signal (e.g., the logic state associated with the second data signal, such as the MSB) such as described in FIGS. 1 and 2. Thus, transmitter 300 may generate multi-level signals that include multiple superimposed signals (e.g., the first data signal and the second data signal represented by a single symbol).

Although a single driver circuit 335 and de-emphasis driver circuit 325 is shown for each data path, there may be multiple driver circuits 335 and multiple de-emphasis (or pre-emphasis) driver circuits 325 per data path. For example, there may be multiple pre-driver circuits 320 and a driver circuit 335 or de-emphasis driver circuit 325 for each pre-driver circuit 320. A driver circuit 335 and a de-emphasis driver circuit 325 may be a pull-up driver circuit or a pull-down driver circuit. For example, a pull-up driver circuit may be used in conjunction with a pull-up pre-driver circuit and a pull-down driver circuit may be used in conjunction with a pull-down pre-driver circuit. In some cases, the de-emphasis driver circuits 325 are pre-emphasis driver circuits or FFE driver circuits, which are configured to receive (and modify the strength of) signals pre-emphasized by a pre-emphasis buffer circuit (or shaped by an FFE circuit).

Although described in the context of de-emphasis, channel equalization as described herein can also be achieved via pre-emphasis. Generally, "pre-emphasis" means increasing a signal amplitude after a transition of the signal. Pre-emphasis in this context can be accomplished by amplifying the high frequency components of the signal (e.g., increasing the energy content of the high frequency components to compensate for degradation of those components due to channel loss), which increases the overall amplitude of the signal. For instance, the high frequency components of a signal can be amplified after transition of the signal by adding an inverted and delayed version of the signal to the original signal. As used herein, "pre-emphasis" may also refer to manipulating a signal so that when it is added to the original signal, the resulting signal is pre-emphasized in the first sense of the word.

To effectuate pre-emphasis in transmitter 300, the de-emphasis buffer circuits 315 may be replaced with pre-emphasis buffer circuits 315 and the de-emphasis drivers 325 may be replaced by pre-emphasis drivers 325. Similar to the de-emphasis buffer circuits, the pre-emphasis buffer circuits may generate control signals that control the behavior of their associated pre-emphasis driver circuits. The control signals may be pulses that have widths shorter than the input data signals, and that are inverted and delayed versions of the input data signals.

To generate such control signals, the pre-emphasis buffer circuit may be configured differently than the de-emphasis buffer circuits shown in transmitter 300. For example, the pre-emphasis buffer circuits may not include a multiplexer 355 or a by-pass path 360. Also, each pre-emphasis buffer circuit may include a pulse generator circuit (e.g., an AND gate at the output of the pre-emphasis buffer circuit). The inputs of the pulse generator may be the enable signal (e.g., EnDe) and a delayed and inverted version of a data signal received by the pre-emphasis buffer circuit. When disabled, the pre-emphasis buffer circuits, pre-driver circuits, and pre-emphasis driver circuits, may be turned off. This is contrary to the de-emphasis implementation, where disabling the de-emphasis buffer circuits, pre-driver circuits, and de-emphasis driver circuits does not turn them off.

The pre-emphasis driver circuits used in the pre-emphasis implementation may be the same as the de-emphasis driver circuits used in the de-emphasis implementation. Alternatively, the pre-emphasis driver circuits may be different than the de-emphasis driver circuits (e.g., to prevent the control pulse from getting attenuated as it propagates through the pre-driver circuits). In one pull-down driver example, a pre-emphasis driver circuit may include two NMOS devices in serial. One NMOS device may be controlled by an enable signal and the other may be controlled by the delayed and inverted version of the data signal output by the pre-emphasis buffer circuits. When such a configuration is used, the pre-emphasis buffer circuits may not include an AND gate.

Figure 4:
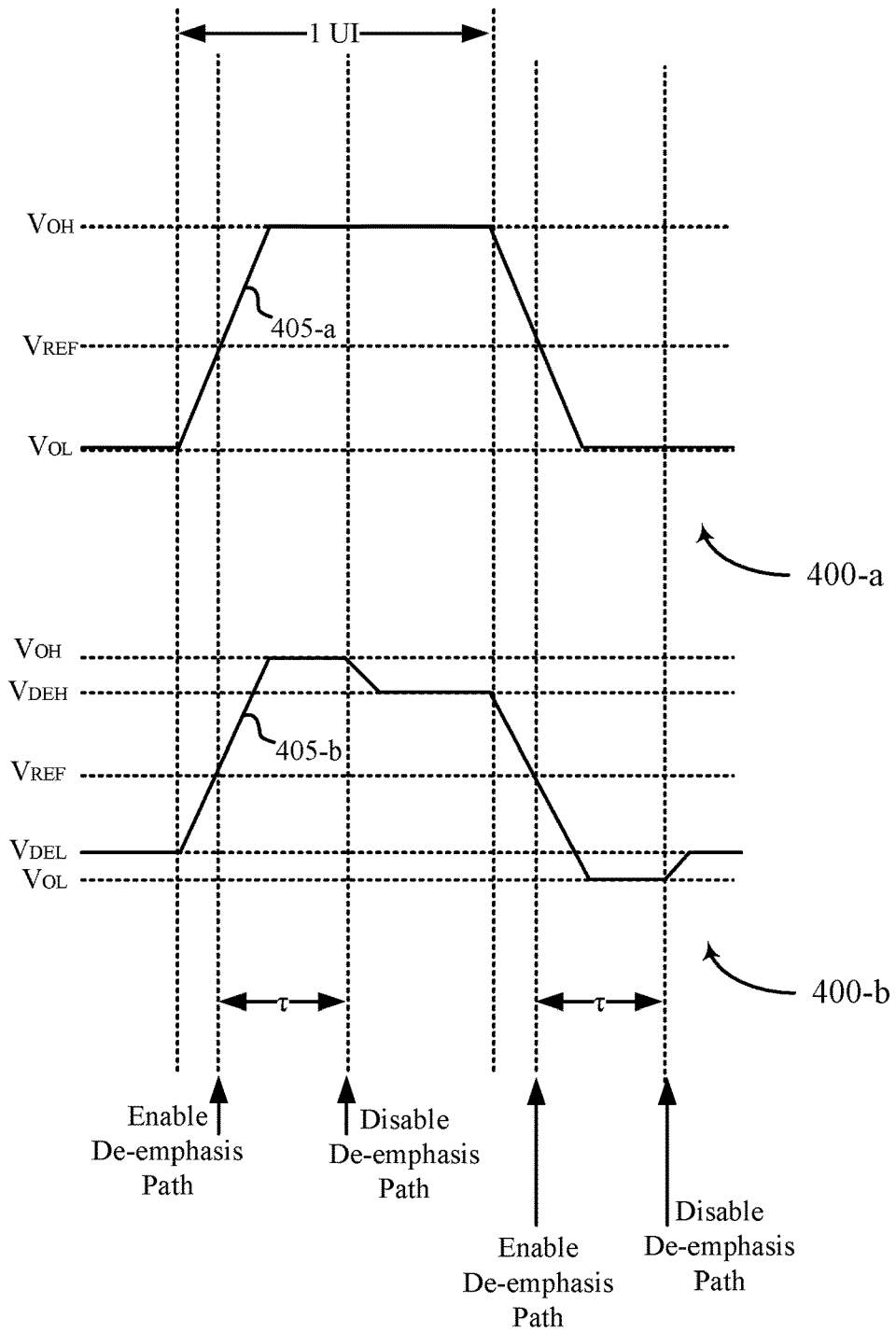
FIG. 4 illustrates plots of multi-level signals in accordance with various aspect of the present disclosure.

FIG. 4 illustrates plots 400 of multi-level signals 405 generated by a multi-level signal transmitter. The transmitter may be an example of the transmitter 300 described with reference to FIG. 3 and the signals 405 may be examples of PAM4 symbols, DQ, output by the transmitter 300. Plot 400-*a* represents a multi-level signal 405-*a* that is generated without using de-emphasis and plot 400-*b* represents a multi-level signal 405-*b* that is generated using de-emphasis. Both plots 400 show the multi-level signals 405 transitioning from a low output voltage level ($V_{OL}$) to a high output voltage level (VOH) and back to the low output voltage level $V_{OL}$. The low output voltage level $V_{OL}$ may be low compared to the reference voltage signal $V_{REF}$ and the high voltage level $V_{OH}$ may be high compared to the reference voltage signal $V_{REF}$. The high voltage level $V_{OH}$ may be associated with a first symbol value (e.g., 0b11) and the low voltage level $V_{OL}$ may be associated with a second symbol value (e.g., 0b10). Although only one set of $V_{OH}/V_{REF}/V_{OL}$ is shown, three different sets of $V_{OH}/V_{REF}/V_{OL}$ may be used in multi-level signaling (i.e., two signaling levels are shown instead of four).

As shown in FIG. 4, the signal 405 may transition from below $V_{REF}$ to $V_{OH}$. Upon this transition (e.g., upon detection of the $V_{REF}$ crossing), de-emphasis may be enabled for signal 405-b (but not for signal 405-a). For example, a de-emphasis buffer circuit 315 may be enabled as described with reference to FIG. 3. However, the de-emphasis may not be applied until expiration of τ, which is the delay associated with the corresponding delay component 345. So disabling of the de-emphasis buffer circuit 315 may coincide with application of the de-emphasis due to the delay τ. Here, τ is a fraction of a unit interval (UI) (which may also be referred to as a bit time). However, in some cases τ is a full UI. Although a UI is shown extending from the beginning of one transition to the beginning of the subsequent transition, a UI may be defined by a different period of time. When de-emphasis is applied, the amplitude of signal 405-b may decrease from $V_{OH}$ to de-emphasized amplitude $V_{DEH}$ due to the suppression of low-frequency components. This is unlike signal 405-a, which stays at $V_{OH}$ until the next transition.

De-emphasis for signal 405-b may be enabled again when signal 405-b crosses $V_{REF}$ during the next transition. But again, because the de-emphasis buffer circuit introduces 315 a delay τ, de-emphasis is not applied until after τ time has elapsed. At this point, the de-emphasis buffer circuit may also be disabled. When de-emphasis is applied, the amplitude of signal 405-b may increase from $V_{OL}$ to de-empha-sized amplitude $V_{DEL}$ due to the suppression of low-fre-quency components (i.e., the absolute magnitude of signal 405's amplitude may decrease, just like when de-emphasis was applied to the signal 405 at $V_{OH}$). This is unlike signal 405-a, which stays at $V_{OL}$ until the next transition. So when de-emphasis is used, the amplitude of signal 405-b may start at $V_{OH}$ or $V_{OL}$ before settling at a lower amplitude (com-pared to $V_{OH}$ or $V_{OL}$). When pre-emphasis is used, however, the amplitude of signal 405-b may temporarily shoot past $V_{OH}$ or $V_{OL}$ (e.g., during a transition) before settling at $V_{OH}$ or $V_{OL}$. The amount of time the amplitude exceeds $V_{OH}$ or $V_{OL}$ may be equal to the time delay τ. And the amount by which the amplitude exceeds $V_{OH}$ or $V_{OL}$ may be deter-mined by the pre-emphasis drivers, as controlled by the pre-emphasis buffer circuits.

De-emphasizing or pre-emphasizing a signal may improve the integrity of the signal, which may increase the likelihood that a receiver is able to successfully receive and decode the signal. Such improvements can readily be seen in an eye diagram comparison.

Figure 5:
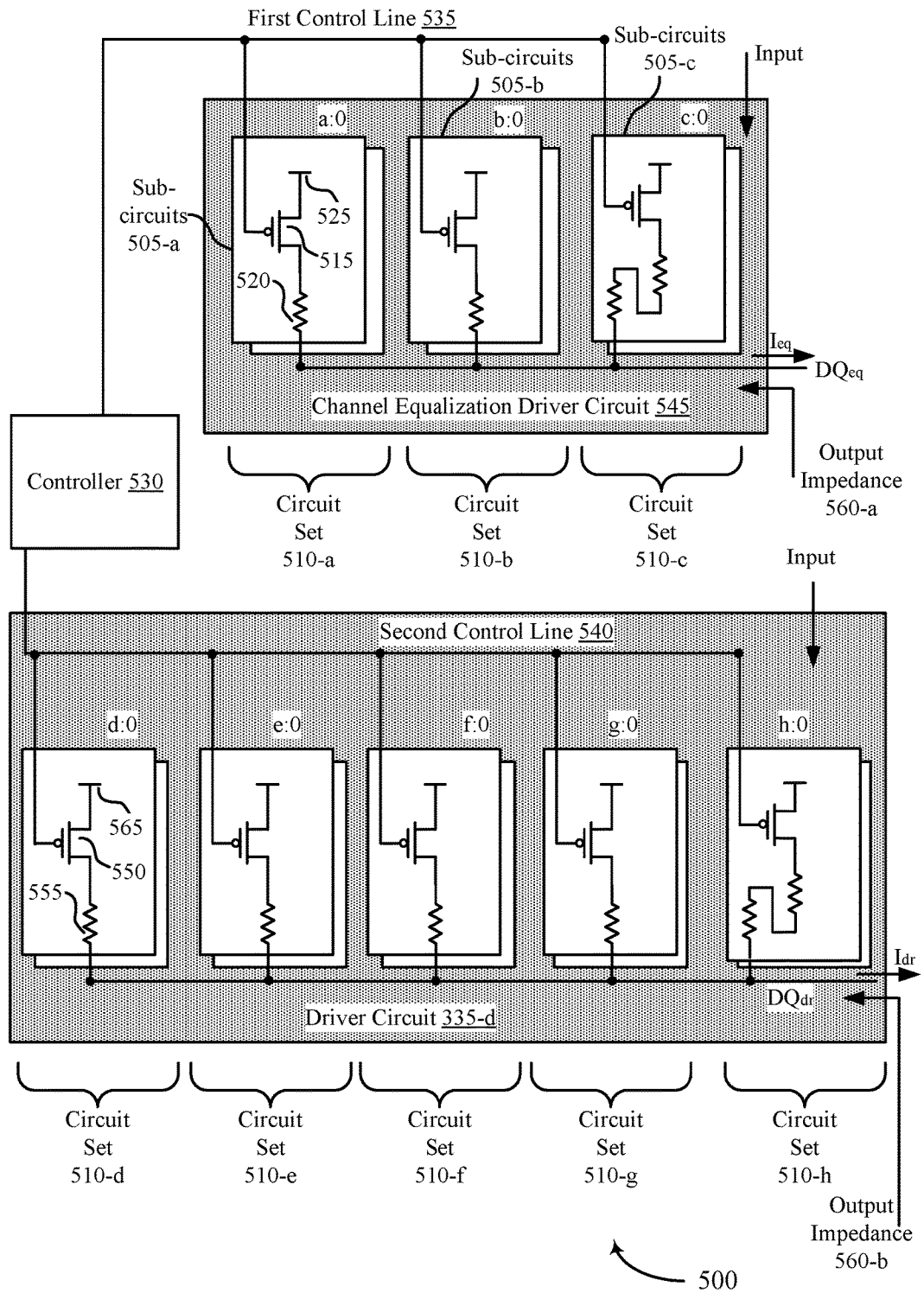
FIG. 5 illustrates a portion of a multi-level signal transmitter that supports programmable channel equalization for multi-level signals in accordance with various aspect of the present disclosure.

FIG. 5 illustrates a portion of multi-level signal transmit-ter 500 that supports programmable channel equalization for multi-level signaling in accordance with examples of the present disclosure. The transmitter 500 may be an example of the transmitter 300 described with reference to FIG. 3. The transmitter 500 may include one or more channel equalization driver circuit(s) 545 and one or more driver circuit(s) 335-d, which may be examples of a de-emphasis driver circuit 325 and driver circuit 335 as described with reference to FIG. 3. In some cases, channel equalization driver circuit 545 is a pre-emphasis driver circuit or FFE driver circuit. As described herein, the channel equalization circuit 545 and driver circuit 335-d may be independently controlled by controller 530. However, the programmable channel equalization techniques described herein are not limited to the specific configurations of channel equalization circuit(s) 545 and driver circuit(s) 335-d depicted in FIG. 5. The controller 530 may be an example of a controller 370 as described with reference to FIG. 3. Additionally or alterna-tively, the controller 530 may include multiple pre-driver circuits 320 (e.g., the control signals output by controller 530 may be the modified versions of the data signals output by pre-drivers 320).

Although shown as pull-up driver circuits, the channel equalization driver circuit 545 and driver circuit 335-d may be pull-up or pull-down driver circuits. Additionally or alternatively, the channel equalization driver circuit 545 and driver circuit 335-d can be implemented using NMOS transistors. Transmitter 500 may also include a controller 530. The controller 530 may control the channel equaliza-tion driver circuit 545 independently from the driver circuit 335-d (e.g., using first control line 535 and second control line 540). Thus, the channel equalization driver circuit 545 may provide programmable channel equalization and the driver circuit 335-d may provide programmable signal drive strength.

Channel equalization driver circuit 545 may include mul-tiple sub-circuits 505. Each sub-circuit 505 may be identical (except for sub-circuits 505-c) and may part of set of circuits that includes multiple (e.g., n) sub-circuits 505 connected in parallel. For example, there may be a+1 sub-circuits 505-a connected in parallel in circuit set 510-a, b+1 sub-circuits connected in parallel in circuit set 510-b, and c+1 sub-circuits 505-c connected in parallel in circuit set 510-c. When the equalization driver circuit 545 is a pull-up driver, each sub-circuit 505 (or circuit set 510) may provide a pre-determined amount of current to a signal at the output of the equalization driver circuit 545 (e.g., the output current of the equalization driver circuit, $I_{eq}$, may be increased by a pre-determined amount). When the equalization driver cir-cuit 545 is a pull-down driver circuit, each sub-circuit 505 (or circuit set 510) may sink a pre-determined amount of current from a signal at the output of the equalization driver circuit 545 (e.g., the output current of the equalization driver circuit, $I_{eq}$, may be reduced by a pre-determined amount). Thus, activation of the sub-circuits 505 (and circuit sets 510) may modify the output current $I_{eq}$ of the equalization driver circuit 545.

Each sub-circuit 505-a may include a transistor 515 connected in series with a resistive component 520 (e.g., a resistor). When the equalization driver circuit 545 is a pull-up driver circuit, the transistor 515 may be a PMOS transistor. The transistors 515 and resistive components 520 may have identical values for each sub-circuit 505, or values within a pre-determined range of each other (e.g., within ±x %). When the equalization driver circuit 545 is a pull-up driver circuit, the sources of the transistors 515 may be connected to (e.g., shorted to, or in electronic communica-tion with) to a positive voltage (e.g., voltage source 525 may be at +pV) and the drains of the transistors 515 may be connected to the resistive components 520. Thus, sub-circuits 505 may provide current when activated as part of a pull-up driver circuit. The additional current may amplify the drive strength of a signal (e.g., a modified data signal output from a pre-driver circuit 320). In some cases, the modified data signal may serve as an input to the equaliza-tion driver circuit 545. Thus, a pull-up equalization driver circuit 545 may modify the strength of an output signal by increasing the output current $I_{eq}$.

Although sub-circuits 505-a through 505-c are shown with the transistors 515 connected in series with resistive components, the sub-circuits may be implemented using alternative (e.g., non-serial) configurations. In some cases, (e.g., in mobile drivers) the sub-circuits 505 may include a configuration of NMOS transistors and no resistive compo-nents. When transmitter 500 includes mobile drivers, the termination topology may be different compared to that depicted in FIG. 5 (e.g., the circuit may terminate at VSSQ, rather than VDDQ).

When the equalization driver circuit 545 is a pull-down driver circuit, the transistor 515 may be an NMOS transistor. When the equalization driver circuit 545 is a pull-down driver circuit, the sources of the transistors 515 may be connected to ground (e.g., voltage source 525 may be at 0V) and the drains of the transistors 515 may be connected to the resistive components 520. Thus, sub-circuits 505 may sink current when activated as part of a pull-down driver circuit. The sunk current may reduce the drive strength of a signal (e.g., a modified data signal output from a pre-driver circuit 320). In some cases, the modified data signal may serve as an input to the equalization driver circuit 545. Thus, a pull-down equalization driver circuit 545 may modify the strength of an output signal by decreasing the output current $I_{eq}$. Thus, each sub-circuit 505 may be configured to modify the output current $I_{eq}$ by a pre-defined amount when activated.

The amount of current provided or sunk by a circuit set 510 may be a function of the number of sub-circuits 505 in the circuit set 510. For example, if a=7 and b=3 activating b+1 (e.g., 4) sub-circuits 505-b in parallel may provide/sink x mA of current, while activating a+1 (e.g., 8) sub-circuits 505-a in parallel may provide/sink more than x mA of current. Sub-circuits 505-c may include additional resistive components 520 (compared to sub-circuits 505-a and 505-b) so that the amount of current provided/sunk by sub-circuits 505-c is half that provided/sunk by sub-circuits 505-b. Such a configuration may allow finer tuning of the equalization driver circuit 545.

Driver circuit 335-d may be similar to channel equalization driver circuit 545. For example, driver circuit 335-d may include multiple circuit sets 510 (e.g., three circuits sets such as 510-b, 510-c, and 510-d) and equalization driver circuit 545 may also include multiple circuit sets (e.g., five circuit sets such as 510-d through 510-h). In some cases, the number of circuit sets 510 included in channel equalization driver circuit 545 may be less than the number of circuit sets 510 included in driver circuit 335-d. Thus, channel equalization driver circuit 545 may be a fractional copy of driver circuit 335-d. Regardless of the number of circuit sets, driver circuit 335-d may function similarly to equalization driver circuit 545.

Like channel equalization driver circuit 545, driver circuit 335-d may include multiple sets of sub-circuits 505. For example, driver circuit 335-d may include d+1 sub-circuits in circuit set 510-d, e+1 sub-circuits in circuit set 510-e, f+1 sub-circuits in circuit set 510-f, g+1 sub-circuits in circuit set 510-g, and h+1 sub-circuits in circuit set 510-h. The sub-circuits 505 in each circuit set 510 may be connected in parallel, and each sub-circuit 505 may be configured to modify the output current of the driver circuit ($I_{dr}$) by a pre-defined amount when activated. Activating a sub-circuit 505 may include turning on the transistor 515 (e.g., biasing the transistor 515) so that current can flow between the drain and the source. De-activating a sub-circuit 505 may include turning transistor 515 off so that current cannot flow between the drain and the source. Although sub-circuits 505-d through 505-h are shown with the transistors 550 connected in series with resistive components, the sub-circuits may be implemented using alternative (e.g., non-serial) configurations.

Similar to the channel equalization driver circuit 545, when the driver circuit 335-d is a pull-up driver, each sub-circuit 505 (or circuit set 510) may provide a pre-determined amount of current to a signal at the output of the driver circuit 335-d (e.g., the output current of the equalization driver circuit, $I_{dr}$, may be increased by a pre-determined amount). And when the driver circuit 335-d is a pull-down driver, each sub-circuit 505 (or circuit set 510) may sink a pre-determined amount of current from a signal at the output of the driver circuit 335-d (e.g., the output current of the equalization driver circuit, $I_{dr}$, may be reduced by a pre-determined amount). Thus, activation of the sub-circuits 505 (and circuit sets 510) may modify the output current $I_{dr}$ of the driver circuit 335-d. The output current $I_{dr}$ of the driver circuit 335-d may be associated with a signal that represents a bit (e.g., the LSB or MSB) in a symbol of a multi-level signal (e.g., a PAM4 symbol). And the output current $I_{eq}$ of the channel equalization driver circuit 545 may be associated with a delayed and inverted version of the signal.

When the driver circuit 335-d is a pull-up driver circuit, the sources of the transistors 550 may be connected to (e.g., shorted to, or in electronic communication with) to a positive voltage (e.g., voltage source 565 may be at +pV) and the drains of the transistors 550 may be connected to the resistive components 555. Thus, sub-circuits 505 may provide current when activated as part of a pull-up driver circuit. The additional current may amplify the drive strength of a signal (e.g., a modified data signal output from a pre-driver circuit 320). In some cases, the data signal may serve as an input to the driver circuit 335-d. Thus, a pull-up driver circuit 335-d may modify the strength of an output signal by increasing the output current $I_{dr}$.

Also similar to the channel equalization driver circuit 545, when the driver circuit 335-d is a pull-down driver circuit, the transistor 550 may be an NMOS transistor. When the driver circuit 335-d is a pull-down driver circuit, the sources of the transistors 550 may be connected to ground (e.g., voltage source 565 may be at 0V) and the drains of the transistors 550 may be connected to the resistive components 555. Thus, sub-circuits 505 may sink current when activated as part of a pull-down driver circuit. The sunk current may reduce the drive strength of a signal (e.g., a modified data signal output from a pre-driver circuit 320). In some cases, the modified signal may serve as an input to the driver circuit 335-d.

Each circuit set 510 (and thus each sub-circuit 505) may be activated by a control signal sent by the controller 530. For example, the circuit sets 510 (and sub-circuits 505) in channel equalization driver circuit 545 may be controlled by a first control signal and the circuit sets 510 (and sub-circuits 505) in driver circuit 335-d may be controlled by a second control signal. The control signals may be received at the gate of the transistors via the control lines. For example, the first control signal may be received over the first control line 535 and the second control signal may be received over the second control line 540. In some cases, the control lines may be electrically isolated from each other. In other cases, the control lines may be separated by switching components (e.g., transistors). The channel equalization driver circuit 545 may be in electronic communication with the first control line 535 and the driver circuit 335-d may be in electronic communication with the second control line 540.

The channel equalization driver circuit 545 may be configured to modify its output current $I_{eq}$ based on the first control signal and the driver circuit 335-d may be configured to modify its output current $I_{dr}$ based on the second control signal. For example, the first control signal may activate one or more circuit sets 510 in channel equalization circuit 545 and the second control circuit may activate one or more circuit sets in driver circuit 335-d. In some cases, the first control signal includes multiple signals and each control signal controls one of the sub-circuits 505 in channel equalization driver circuit 545. Thus, the first control signal may include a first set of signals and the second control signal may include a second set of signals different than the first set of signals. In some cases, the second control signal includes multiple signals and each signal controls one of the sub-circuits 505 in driver circuit 335-d. In some cases, the first control signal is a binary weighted control signal and the second control signal is a binary weighted control signal.

The first control signal and the second control signal may be different so that the ratio of drive strength to channel equalization can be tailored to the application. That is, the ratio may be flexible since the channel equalization can be selected independent of the drive strength. For instance, the channel equalization may be selected to that it remains fixed, even when the drive strength increase. Alternatively, the channel equalization may be dynamically controlled so that it increases when the drive-strength increases, or decreases when the drive strength increases. Or the channel equalization may be dynamically controlled so that it decreases when the drive-strength decreases, or increases when the drive strength decreases. Such flexibility is prevented when a single control signal is used to control both the channel equalization driver circuit 545 and the driver circuit 335-d.

In some cases, the output signal of the channel equalization driver circuit 545 may be combined with the output signal of the driver circuit 335-d (e.g., $DQ_{eq}$ may be combined with $DQ_{dr}$). The output signal of the channel equalization driver circuit 545 may be associated with the output current $I_{eq}$ and the output signal of the driver circuit 335-d may be associated with the output current $I_{dr}$. The combined signals may be superimposed with other signals from the transmitter 500 to create multi-level signals (e.g., PAM4 signals) with programmable drive strength and channel equalization. The combined signals may be transferred to a receiver circuit (e.g., a receiver 130 such as described with reference to FIG. 1).

In some cases, the control signals may be selected to adjust or modify the effective output impedance of the channel equalization driver circuit 545 and the driver circuit 335-d. The effective output impedance may be a combination of the output impedance seen looking into the channel equalization driver circuit 545 (e.g., output impedance 560-a) and the output impedance seen looking into the driver circuit 335-d (e.g., output impedance 560-b). Since the symmetry (or linearity) of a multi-level signal's output swing is a function of the effective output impedance, the control signals may be selected so that the effective impedance matches a target impedance that has been determined to improve linearity. This is because the effective impedance is a function of the output current $I_{eq}$ and the output current $I_{dr}$ (e.g., the output impedance 560-a is a function of the modified output current $I_{eq}$ and the output impedance 560-b is a function of the modified output current $I_{dr}$). Thus, the first control signal may be selected based on the target impedance and the second control signal may be selected based on the target impedance. For example, the controls signals may be selected so that the output currents result in an effective impedance that is within a pre-determined range (e.g., ±s %) of the target impedance.

Although shown with similar example circuit structures, the channel equalization driver circuit 545 and the driver circuit 335-d perform different functions and may vary in configuration. For example, the output current $I_{dr}$ provided by driver circuit 335-d may modify the drive strength of a signal that is superimposed with other signals to create a PAM4 symbol. Similarly, the output current $I_{eq}$ provided by channel equalization driver circuit 545 may modify the drive strength of an output signal, which also contributes to the PAM4 symbol. As described above, the difference in drive strengths provided by the channel equalization driver circuit 545 and the driver circuit 335-d can be realized by using different control signals for the circuit.

In addition to being controlled by different control signals, the channel equalization driver circuit 545 and driver circuit 335-d may vary in configuration so that a particular level of granularity, control, and drive strength can be realized for each circuit. For example, the channel equalization driver circuit 545 and driver circuit 335-d may include a different number of circuit sets 510, and/or a different number of sub-circuits 505 per circuit set 510, and/or components with different values in each sub-circuit 505. Additionally or alternatively, the channel equalization driver circuits 545 may be connected to different voltage or current sources than driver circuit 335-d (e.g., voltage source 525 may be different than voltage source 565).

Figure 6:
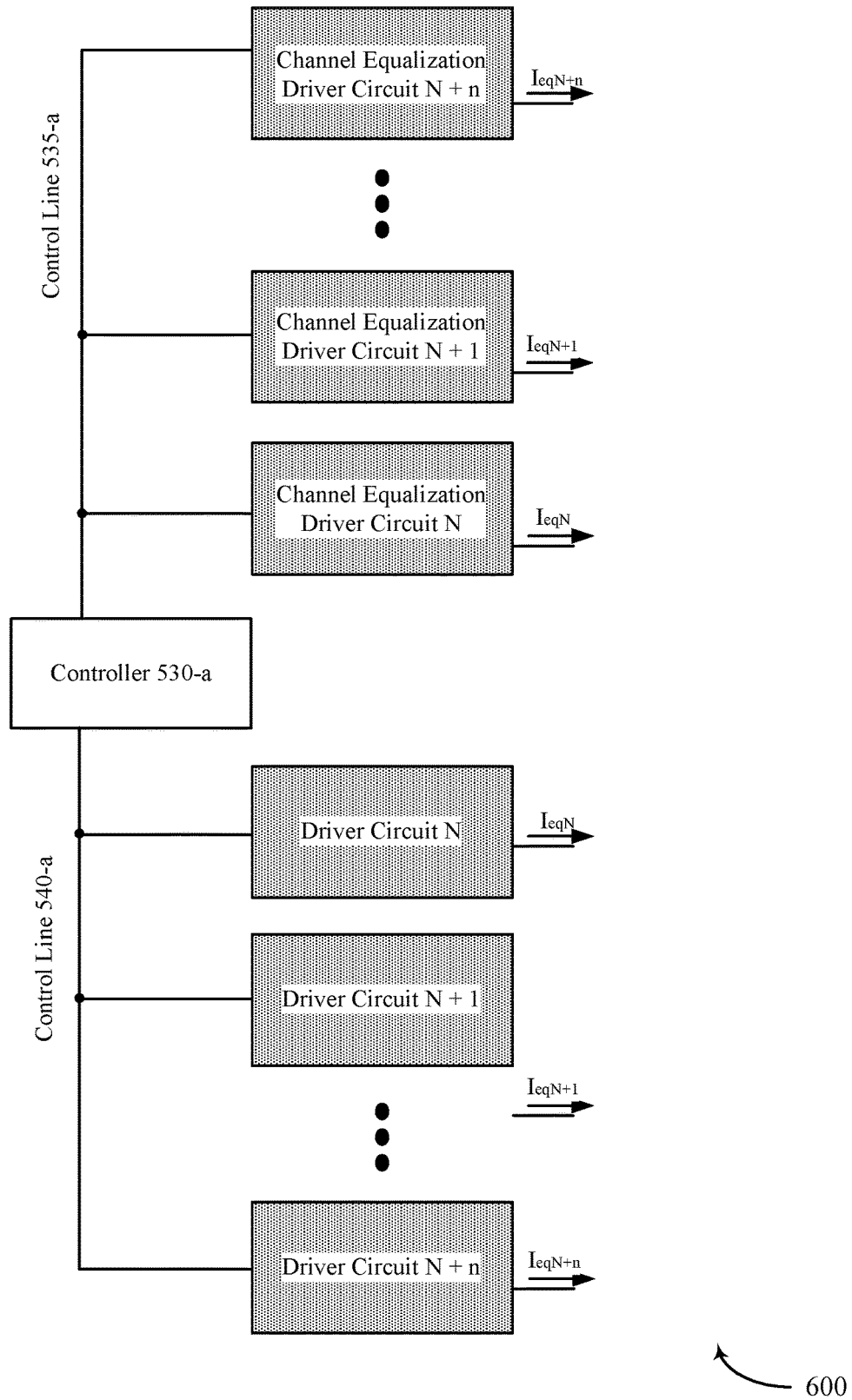
FIG. 6 illustrates a portion of a multi-level signal transmitter that supports programmable channel equalization for multi-level signals in accordance with various aspect of the present disclosure.

FIG. 6 illustrates a portion of multi-level signal transmitter 600 that supports programmable channel equalization for multi-level signaling in accordance with examples of the present disclosure. The transmitter 600 may be an example of the transmitter 300 described with reference to FIG. 3 or the transmitter 500 described with reference to FIG. 5. The transmitter 600 may include a set of equalization driver circuits and a set of driver circuits. The equalization driver circuits may be examples of channel equalization driver circuits 545 or examples of circuit sets 510 within a single channel equalization driver circuit 545. The driver circuits may be examples of driver circuits 335-d or examples of circuit sets 510 within a single driver circuit 335-d.

In some cases, equalization driver circuits are a pre-emphasis driver circuits or FFE driver circuits. The channel equalization driver circuits and driver circuits may be a pull-up or pull-down driver circuits. Transmitter 600 may also include a controller 530-a. The controller 530-a may use different control signals for controlling the equalization driver circuits and the driver circuits. The channel equalization driver circuits may provide programmable channel equalization and the driver circuit may provide programmable signal drive strength.

The channel equalization driver circuits may be in electronic communication with a first control line 535-a and the driver circuits may be in electronic communication with a second control line 540-a. The controller 530-a may transfer a first control signal to the channel equalization driver circuits and a second control signal to the driver circuits. The first control signal may activate one or more of the channel equalization driver circuits and the second control signal may activate one or more of the driver circuits. The first control signal and the second control signal may be separate signals. In some cases, the control signals may also de-activate one or more of the driver circuits.

Each channel equalization driver circuit may be configured to provide a unique amount of current (or drive strength) to an equalized (e.g., de-emphasized or pre-emphasized) signal by modifying an output current of the channel equalization driver circuit. For example, channel equalization driver circuit N+n may be configured to provide output current $I_{eqN+n}$, channel equalization driver circuit N+1 may be configured to provide output current $I_{eqN+1}$, and channel equalization driver circuit N may be configured to provide output current $I_{eqN}$. Thus, channel equalization may be adaptively tuned or selected by activating one of the channel equalization driver circuits.

Similarly, each driver circuit may be configured to provide a unique amount of current (or drive strength) to a signal by modifying an output current of the driver circuit. For example, driver circuit N+n may be configured to provide output current $I_{drN+n}$, driver circuit N+1 may be configured to provide output current $I_{drN+1}$, and driver circuit N may be configured to provide output current $I_{drN}$. Thus, drive strength may be adaptively tuned or selected by activating one of the driver circuits. Accordingly, the drive strength and equalization of a multi-level signal may be programmed by activating one of the channel equalization driver circuits and one of the driver circuits. In some cases, the techniques described with reference to FIG. 3 can be combined with the techniques described with reference to FIG. 5 to provide even more control.

In some cases, a subset of driver circuits within a set of driver circuits may be independently controlled relative to the other driver circuits in the set. For example, controller 530-*a* may send a first control signal to driver circuit N and a second control signal to driver circuit N+1. The first control signal may activate or deactivate driver circuit N and the second control signal may activate or deactivate driver circuit N+1. The first control signal and the second control signal may be distinct signals. Channel equalization driver circuits may similarly be controlled independent of one another. For example, different control signals may be sent to different channel equalization driver circuits so that certain combinations of channel equalization driver circuits can be activated and deactivated during a period of time.

The first control line 535-*a* and the second control line 540-*a* may be conductive paths or traces. In some cases, the first control line 535-*a* and the second control line 540-*a* may be electrically isolated from each other or may be capable of electrical isolation (e.g., via one or more switches). Components or lines are isolated from each other if there is an open circuit between them. For example, two components physically connected by a switch may be isolated from each other when the switch is open. Isolating control lines may allow a controller 530-*a* to separately control channel equalization driver circuits and driver circuits as described herein. Additionally or alternatively, isolating control lines may allow a controller 530-*a* to separately control individual (or subsets of) channel equalization driver circuits within a set of channel equalization driver circuits, or to separately control individual (or subsets of) driver circuits within a set of driver circuits.

Figure 7:
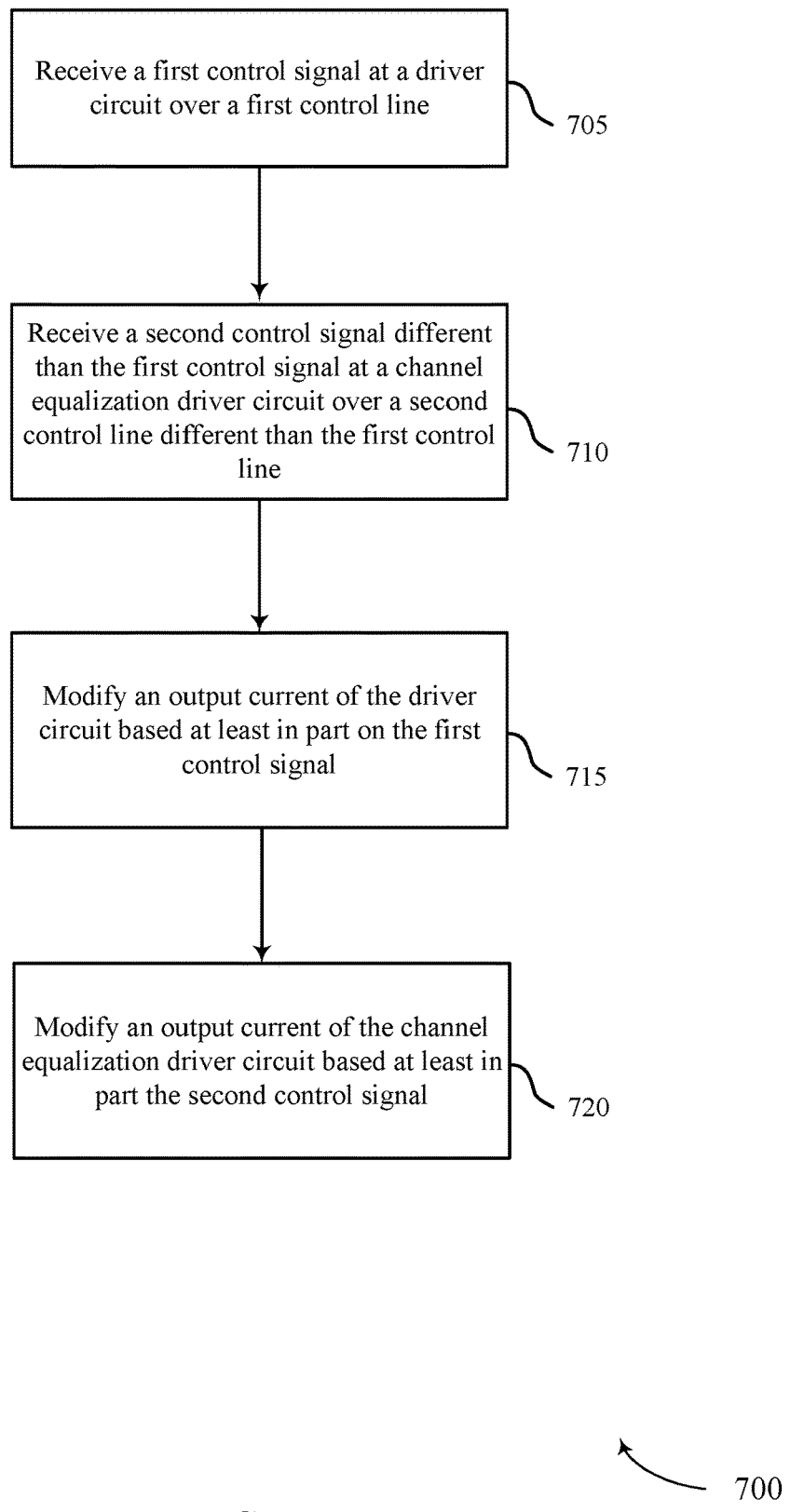
FIG. 7 shows a flowchart illustrating a method of programmable channel equalization for multi-level signals in accordance with various aspect of the present disclosure.

FIG. 7 shows a flowchart illustrating a method 700 that supports programmable channel equalization for multi-level signaling in accordance with aspects of the present disclosure. The operations of method 700 may be implemented by a transmitter or its components as described herein. For example, the operations of method 700 may be performed by a transmitter as described with reference to FIGS. 3, 5, and 6.

At 705 the method may include receiving a first control signal at a driver circuit over a first control line. In some cases, the driver circuit includes multiple sub-circuits and the first control signal activates at least one of the sub-circuits. At 710, the method may include receiving a second control signal different than the first control signal at a channel equalization driver circuit over a second control line different than the first control line. In some cases, the channel equalization driver circuit includes multiple sub-circuits and the second control signal activates at least one of the sub-circuits. At 715, the method may include modifying an output current of the driver circuit based at least in part on the first control signal. At 720, the method may include modifying an output current of the channel equalization driver circuit based at least in part the second control signal.

In some cases, the method includes receiving the first control signal at a second driver circuit over the first control line. In such cases, the first control signal may de-activate the driver circuit and deactivate the second driver circuit. In some cases, the method may include receiving the first control signal at a second channel equalization driver circuit over the second control line. In such cases, the second control signal may activate the channel equalization driver circuit and de-deactivate the second channel equalization driver circuit.

In some cases, the method includes combining a first output signal associated with the output current of the driver circuit and a second output signal associated with the output current of the channel equalization driver circuit. In such cases, the method may also include transferring or transmitting the combination of the output signals to a receiver circuit. In some cases, the method may include determining an input impendence of the receiver circuit. The receiver circuit may be in electronic communication with the driver circuit. In such cases, the method may also include selecting the first control signal based at least in part on the input impedance of a receiver circuit.

In some cases, the method may include receiving a data signal at the driver circuit and receiving a control signal at the channel equalization driver circuit. In such cases, modifying the output current of the driver circuit may be based at least in part on modifying a strength of the data signal and modifying the output current of the channel equalization driver circuit may be based at least in part on modifying a strength of the channel equalization version of the data signal.

In some cases, the method may include determining a target impedance. In such cases, the method may also include selecting the first control signal based at least in part on the target impedance and selecting the second control signal based at least in part on the target impedance. In such cases, the output impedance of the driver circuit and the output impedance of the channel equalization driver circuit may provide an effective output impedance that is within a pre-determined range of the target impedance. In some cases, the output impedance of the driver circuit is a function of the modified output current of the driver circuit the output impedance of the channel equalization driver circuit is a function of the modified output current of the channel equalization driver circuit.

In some cases, the method may include activating at least one sub-circuit of the driver circuit based at least in part on the first control signal. In such cases, modifying the output current of the driver circuit may be based at least in part on activating the at least one sub-circuit of the driver circuit. In some cases, the method may include activating at least one sub-circuit of the channel equalization driver circuit based at least in part on the second control signal. In such cases, modifying the output current of the channel equalization driver circuit may be based at least in part on activating the at least one sub-circuit of the channel equalization driver circuit.

In some cases, the method may include receiving a data signal from a data array at a de-emphasis (or pre-emphasis) buffer circuit and generating a control signal using the de-emphasis (or pre-emphasis) buffer circuit. In such cases, the method may also include transferring the control signal from the de-emphasis (or pre-emphasis) buffer circuit to a pre-driver circuit, modifying the control signal at the pre-driver circuit, and transferring the modified control signal to the channel equalization driver circuit.

The techniques described herein may be implemented via a transmitter. The transmitter may include a driver circuit that has a first input in electronic communication with an output of a first pre-driver circuit. The driver circuit may also have a second input in electronic communication with a first control line. The driver circuit may be configured to modify a strength of a first output signal of the first pre-driver circuit based at least in part on a first control signal received over the first control line. The transmitter may also include a channel equalization driver circuit that has a third input in electronic communication with an output of a second pre-driver circuit. The channel equalization driver circuit may also have a fourth input in electronic communication with a second control line. The channel equalization driver circuit may be configured to modify a strength of a second output signal of the second pre-driver circuit based at least in part on a second control signal received over the second control line. The channel equalization driver circuit may be a de-emphasis driver circuit or a pre-emphasis driver circuit.

In some cases, the driver circuit may be configured to modify the strength of the first output signal by increasing an output current of the driver circuit or decreasing an output current of the driver circuit. In some cases, the channel equalization driver circuit may be configured to modify the strength of the second output signal by increasing an output current of the channel equalization driver circuit or decreasing an output current of the channel equalization driver circuit.

In some cases, the transmitter may include a driver circuit in electronic communication with a first control line. The driver circuit may be configured to modify its output current based at least in part on a first control signal received over the first control line. The transmitter may also include a channel equalization driver circuit in electronic communication with a second control line different than the first control line. The channel equalization driver circuit may be configured to modify its output current based at least in part on a second control signal received over the second control line.

In some cases, the first control signal includes a first set of signals and the second control signal includes a second set of signals different than the first set of signals. In some cases, the first control signal and the second control signal includes binary weighted control signals. In some cases, the first control signal and the second control signal are different signals.

In some cases, the transmitter includes a first pre-driver circuit configured to modify a data signal and transfer the modified data signal to the driver circuit and a second pre-driver circuit configured to modify a control signal generated from the data signal. The second pre-driver circuit may be configured to transfer the modified control signal to the channel equalization driver circuit. In such cases, the driver circuit may be configured to modify its output current by modifying a strength of an output signal and the channel equalization driver circuit may be configured to modify its output current by modifying a strength of an output signal.

In some cases, the driver circuit includes multiple sub-circuits and each sub-circuit is controlled by the first control signal. Each sub-circuit may configured to modify the output current of the driver circuit by a pre-defined amount when activated. In some cases, the channel equalization driver circuit includes multiple sub-circuits and each sub-circuit is controlled by the second control signal. Each sub-circuit may also be configured to modify the output current of the channel equalization driver circuit by a pre-defined amount when activated.

It should be noted that the methods described above describe possible implementations, and that the operations and the steps may be rearranged or otherwise modified and that other implementations are possible. Furthermore, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

The term "isolated" refers to a relationship between components in which electrons are not presently capable of flowing between them; components are isolated from each other if there is an open circuit between them. For example, two components physically connected by a switch may be isolated from each other when the switch is open.

As used herein, the term "shorting" refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the flow of charge between components (or lines) that are in electronic communication.

The devices discussed herein, including memory device 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
a driver circuit in electronic communication with a first control line, the driver circuit configured to modify its output current based at least in part on a first control signal received over the first control line, wherein the output current of the driver circuit is associated with a signal representing a bit in a symbol of a multi-level signal; and
a channel equalization driver circuit in electronic communication with a second control line different than the first control line, the channel equalization driver circuit comprising a plurality of sub-circuits each controlled by a second control signal received over the second control line, wherein the output current of the channel equalization driver circuit is associated with a delayed and inverted version of the signal representing the bit in the symbol of the multi-level signal.

2. The apparatus of claim 1, wherein the first control signal comprises a first set of signals and the second control signal comprises a second set of signals different than the first set of signals.

3. The apparatus of claim 1, further comprising:
a first pre-driver circuit configured to transfer the first control signal to the driver circuit; and
a second pre-driver circuit configured to and transfer the second control signal to the channel equalization driver circuit.

4. The apparatus of claim 1, wherein the driver circuit comprises a plurality of sub-circuits and each sub-circuit is controlled by the first control signal.

5. The apparatus of claim 4, wherein each sub-circuit is configured to modify the output current of the driver circuit by a pre-defined amount when activated.

6. The apparatus of claim 1, wherein each sub-circuit is configured to modify the output current of the channel equalization driver circuit by a pre-defined amount when activated.

7. The apparatus of claim 1, wherein the channel equalization driver circuit comprises a first plurality of sub-circuits and the driver circuit comprises a second plurality of sub-circuits different than the first plurality of sub-circuits.

8. A method, comprising:
receiving a first control signal at a driver circuit over a first control line;
receiving a second control signal different than the first control signal at a channel equalization driver circuit over a second control line different than the first control line;
receiving the second control signal at a second channel equalization driver circuit over the second control line, wherein the second control signal activates the channel equalization driver circuit and de-activates the second channel equalization driver circuit;
modifying an output current of the driver circuit based at least in part on the first control signal; and
modifying an output current of the channel equalization driver circuit based at least in part the second control signal.

9. The method of claim 8, wherein the driver circuit comprises a plurality of sub-circuits and the first control signal activates at least one sub-circuit of the plurality of sub-circuits.

10. The method of claim 8, wherein the channel equalization driver circuit comprises a plurality of sub-circuits and the second control signal activates at least one sub-circuit of the plurality of sub-circuits.

11. The method of claim 8, further comprising:
combining a first output signal associated with the output current of the driver circuit and a second output signal associated with the output current of the channel equalization driver circuit; and
transferring the combined first and second output signals to a receiver circuit.

12. The method of claim 8, further comprising:
receiving a data signal at the driver circuit; and
receiving a delayed and inverted version of the data signal at the channel equalization driver circuit, wherein modifying the output current of the driver circuit is based at least in part on modifying a strength of the data signal, and wherein modifying the output current of the channel equalization driver circuit is based at least in part on modifying a strength of the delayed and inverted version of the data signal.

13. The method of claim 8, further comprising:
activating at least one sub-circuit of the driver circuit based at least in part on the first control signal, wherein modifying the output current of the driver circuit is based at least in part on activating the at least one sub-circuit of the driver circuit.

14. The method of claim 8, further comprising:
activating at least one sub-circuit of the channel equalization driver circuit based at least in part on the second control signal, wherein modifying the output current of the channel equalization driver circuit is based at least in part on activating the at least one sub-circuit of the channel equalization driver circuit.

15. The method of claim 8, wherein the channel equalization driver circuit comprises a de-emphasis driver circuit or a pre-emphasis driver circuit.

16. A method, comprising:
receiving a first control signal at a driver circuit over a first control line;
receiving a second control signal different than the first control signal at a channel equalization driver circuit over a second control line different than the first control line;
receiving the first control signal at a second driver circuit over the first control line, wherein the first control signal activates the driver circuit and de-activates the second driver circuit;
modifying an output current of the driver circuit based at least in part on the first control signal; and
modifying an output current of the channel equalization driver circuit based at least in part the second control signal.

17. An apparatus, comprising:
a driver circuit comprising a first input in electronic communication with an output of a first pre-driver circuit and a second input in electronic communication with a first control line, the driver circuit configured to modify a strength of a first output signal of the first pre-driver circuit based at least in part on a first control signal received over the first control line; and
a channel equalization driver circuit comprising a third input in electronic communication with an output of a second pre-driver circuit and a fourth input in electronic communication with a second control line, the channel equalization driver circuit configured to modify, based at least in part on a second control signal received over the second control line, a strength of a second output signal of the second pre-driver circuit by increasing or decreasing an output current of the channel equalization driver circuit.

18. The apparatus of claim 17, wherein the driver circuit is configured to modify the strength of the first output signal by increasing an output current of the driver circuit or decreasing an output current of the driver circuit.

19. The apparatus of claim 17, wherein the channel equalization driver circuit comprises a de-emphasis driver circuit or a pre-emphasis driver circuit.

* * * * *